(12) United States Patent
Takahashi

(10) Patent No.: US 7,847,376 B2
(45) Date of Patent: Dec. 7, 2010

(54) SEMICONDUCTOR DEVICE AND MANUFACTURING METHOD OF THE SAME

(75) Inventor: Noriyuki Takahashi, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 57 days.

(21) Appl. No.: 12/176,477

(22) Filed: Jul. 21, 2008

(65) Prior Publication Data
US 2009/0020860 A1    Jan. 22, 2009

(30) Foreign Application Priority Data
Jul. 19, 2007   (JP) .............................. 2007-187789
Dec. 7, 2007    (JP) .............................. 2007-316920

(51) Int. Cl.
*H01L 21/60* (2006.01)
(52) U.S. Cl. .............................. 257/670; 257/E23.043; 257/E21.51; 438/123
(58) Field of Classification Search ................. 257/670
See application file for complete search history.

(56) References Cited

U.S. PATENT DOCUMENTS 5,378,656 A   1/1995   Kajihara et al.

2004/0256707 A1*  12/2004   Sugimori .................... 257/678
2005/0098862 A1*   5/2005   Kiyohara ..................... 257/666
2006/0186528 A1*   8/2006   Sasaki et al. ................ 257/690
2007/0004092 A1*   1/2007   Suzuki et al. ............... 438/123

FOREIGN PATENT DOCUMENTS

JP      11-168169 A    6/1999
JP      11-224929 A    8/1999

* cited by examiner

*Primary Examiner*—Jarrett J Stark
*Assistant Examiner*—Lawrence Tynes, Jr.
(74) *Attorney, Agent, or Firm*—Miles & Stockbridge P.C.

(57) ABSTRACT

A semiconductor device of a multi-pin structure using a lead frame is provided. The semiconductor device comprises a tab having a chip supporting surface, the chip supporting surface whose dimension is smaller than a back surface of a semiconductor chip, a plurality of leads arranged around the tab, the semiconductor chip mounted over the chip supporting surface of the tab, a plurality of suspending leads for supporting the tab, four bar leads arranged outside the tab so as to surround the tab and coupled to the suspending leads, a plurality of wires for coupling between the semiconductor chip and the leads, and a sealing body for sealing the semiconductor chip and the wires with resin, with first slits being formed respectively in first coupling portions of the bar leads for coupling with the suspending leads.

25 Claims, 33 Drawing Sheets

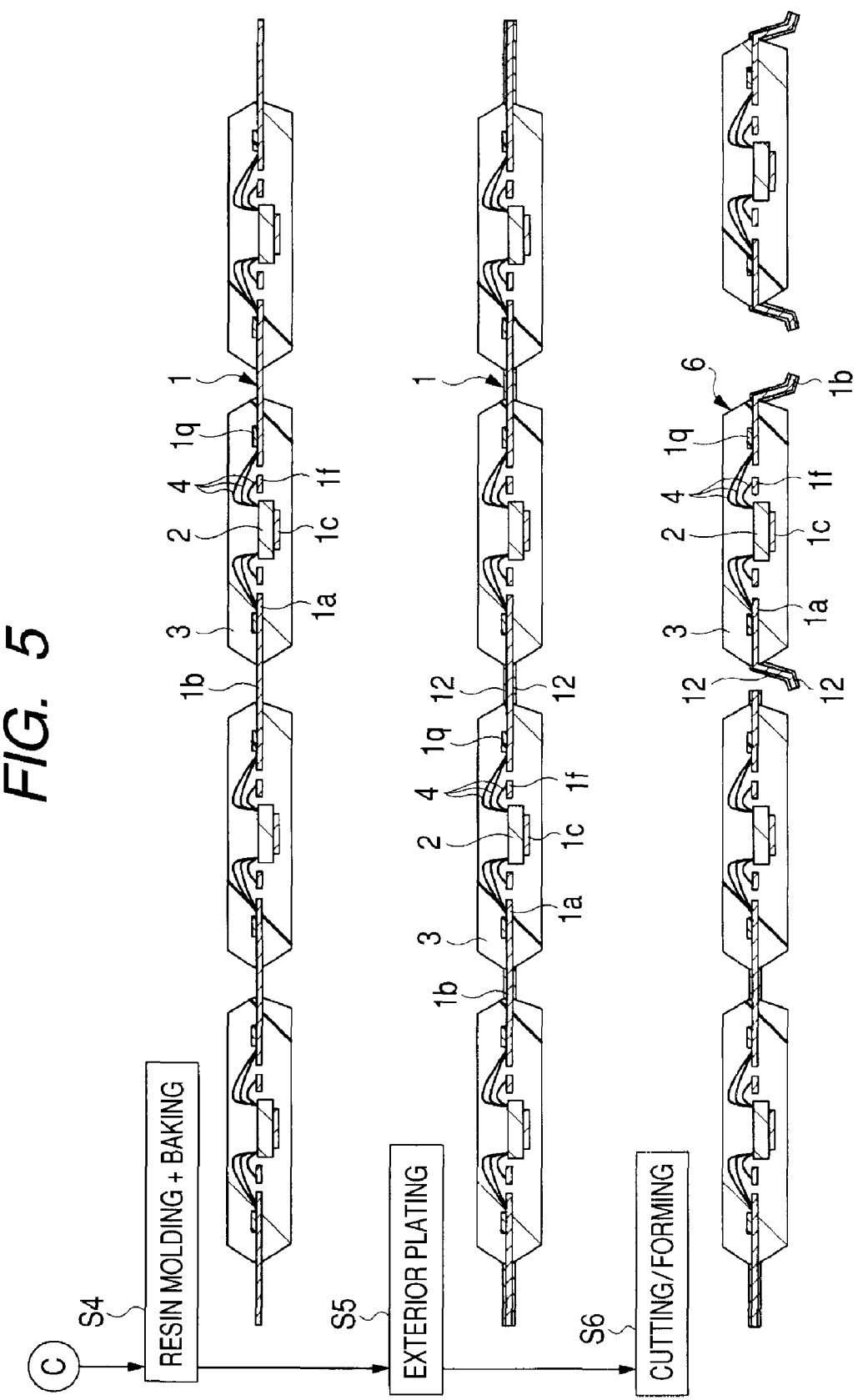

SEMICONDUCTOR DEVICE AND MANUFACTURING METHOD OF THE SAME

The disclosure of Japanese Patent Applications No. 2007-316920 and No. 2007-187789 respectively filed on Dec. 7, 2007 and on Jul. 19, 2007 each including the specification, drawings and abstract are incorporated herein by reference in its entirety.

BACKGROUND OF THE INVENTION

The present invention relates to a semiconductor device and particularly to a technique applicable effectively to a semiconductor device which is assembled using a lead frame.

According to a known technique (see, for example, Patent Literature 1), there are used ground coupling portions arranged between a semiconductor chip and inner leads and coupled electrically by wire bonding to pads for ground of the semiconductor chip, the ground coupling portions being electrically coupled to and supported by tab suspending leads to stabilize the ground potential.

There also is known a technique which uses a lead frame having die pads smaller in size than a semiconductor chip and couples suspending leads of the lead frame and inner leads with each other using an insulating tape (see, for example, Patent Literature 2).

[Patent Literature 1]
Japanese Unexamined Patent Publication No. Hei 11 (1999)-168169

[Patent Literature 2]
Japanese Unexamined Patent Publication No. Hei 11 (1999)-224929

SUMMARY OF THE INVENTION

With the recent tendency to higher performance of semiconductor devices, there also is a tendency to an increase in the number of external terminals (the number of pins) for exchange of data signals for example between a semiconductor device and external electronic devices. As a configuration which implements such a multi-pin semiconductor device there is known, for example, BGA (Ball Grid Array). BGA is of a structure wherein a semiconductor chip is mounted on a main surface of a wiring substrate and ball electrodes as external terminals are provided on a back surface of the wiring substrate. This structure is suited for a multi-pin structure. However, since the wiring substrate is of a structure having wiring layers and insulating layers formed as multiple layers, the material cost is higher than that of the lead frame and the BGA manufacturing cost is also relatively high. Recently, as means for reducing the BGA manufacturing cost, the so-called MAP (Multi Array Package) method has been considered effective wherein areas for forming plural semiconductor devices are provided on one semiconductor substrate and, after mounting semiconductor chips in those areas respectively, the areas are subjected to block molding with resin.

However, as the product size for each BGA increases due to the multi-pin structure, it is only four to five products that can be obtained from one wiring substrate, and the manufacturing cost rather becomes high as a result of using a block molding type matrix substrate (a substrate for MAP). For attaining the reduction of cost, it is effective to adopt a lead frame type such as QFP (Quad Flat Package).

By using a lead frame it is possible to reduce the manufacturing cost because wiring layers and insulating layers are not distributed multi-layerwise unlike the wiring substrate used in BGA.

However, QFP is of a configuration including a tab capable of mounting a semiconductor chip thereon and plural leads arranged around the tab. That is, since leads serving as external terminals are arranged in a peripheral edge portion of a semiconductor device, a dimension of the semiconductor device becomes larger with an increase in the number of pins.

As one means for attaining a multi-pin structure in a lead frame type semiconductor device while attaining the reduction in size of the semiconductor device it is effective to adopt such a technique as is disclosed in the foregoing Patent Literature 1 (Japanese Unexamined Patent Publication No. Hei 11 (1999)-168169) wherein a power supply and GND (ground) are made common to reduce the number of terminals (external terminals) drawn out to the exterior. More particularly, a common lead called bus bar lead or bar lead is provided and wires such as power supply and GND wires are coupled to the bus bar lead to use the lead in common, thereby attaining a multi-pin structure while reducing the number of terminals drawn out to the exterior.

However, since the lead frame is formed of metal, the lead frame is apt to undergo expansion or contraction (thermal strain) under the influence of heat in a die bonding process for mounting a semiconductor chip and also in a wire bonding process for coupling the semiconductor chip and leads electrically with each other through wires. Such expansion and contraction are apt to occur particularly when the lead frame is formed of such a metal as copper alloy. In the wire bonding process, wire bonding can be done in a state in which a part (a more outside area than the wire-coupled portion) of each lead is fixed with a clamping jig (clamper). But, a bus bar lead which planarly overlaps the area where the semiconductor chip-leads coupling wires are formed cannot be clamped with the clamping jig. Consequently, when an expanding action is exerted on the lead frame, the bus bar lead becomes unable to expand in the horizontal direction because its both ends are fixed to tab suspending leads, with consequent deflection of the bus bar lead. If the bus bar lead and wires are coupled together in such a state, the $2^{nd}$ side not clamped by the clamping jig jumps up, causing non-pressure bonding of wires, which might lead to peeling (breaking) of wires.

Vacuum chucking may be effective as a bus bar lead fixing method. However, even if vacuum chucking is performed, it is difficult to fully suppress the deflection of the lead frame. Moreover, the temperature of a heat stage used in the wiring bonding process varies due to evacuation and likewise a defective coupling of wires is apt to occur.

It is necessary that the wires to be coupled with leads be bonded while straddling the bus bar lead. Therefore, if the bus bar lead is deflected due to a thermal strain, there will occur wire shorting.

Further, by such a mere ring-like arrangement of the bus bar lead as shown in the foregoing Patent Literature 1, there also will occur fluctuation of the tab in synchronism with a thermal fluctuation of the bus bar lead.

Besides, since the number of inner leads also increases due to the multi-pin structure, the inner lead tip shape becomes convergent, thus giving rise to the problem that the rigidity of the inner leads is deteriorated.

Moreover, as the number of inner leads increases due to the multi-pin structure, the pitch between leads becomes smaller, so that the fluidity of molding resin in resin molding is deteriorated.

In the foregoing Patent Literature 1 there is a description of a small tab structure wherein ground coupling portions are provided between the tab and inner leads. In the foregoing Patent Literature 2 (Japanese Unexamined Patent Publication No. Hei 11 (1999)-224929) there is a description of a small tab structure wherein suspending leads are bent.

In both Patent Literatures 1 and 2, however, there is found no description about a countermeasure to the bus bar lead that deflects due to expansion or contraction under the influence of heat of the lead frame.

It is an object of the present invention to provide a technique which permits the manufacture of a multi-pin semiconductor device using a lead frame.

It is another object of the present invention to provide a technique capable of attaining the reduction in cost of a semiconductor device.

It is a further object of the present invention to provide a technique capable of improving the reliability of a semiconductor device.

It is a still further object of the present invention to provide a technique capable of improving the quality of a semiconductor device.

The above and other objects and novel features of the present invention will become apparent from the following description and accompanying drawings.

The following is an outline of a typical mode of the present invention as disclosed herein.

A semiconductor device comprises: a chip mounting portion having a chip supporting surface, in which a dimension of the chip supporting surface is smaller than that of a back surface of a semiconductor chip; a plurality of leads arranged around the chip mounting portion; the semiconductor chip mounted over the chip supporting surface of the chip mounting portion; a plurality of suspending leads for supporting the chip mounting portion; and bar-like common leads arranged outside the chip mounting portion such that the common leads surround the chip mounting portion and coupled to the suspending leads, wherein a first slit is formed in the common lead.

A method for manufacturing a semiconductor device, comprises the steps of: providing a lead frame comprising a chip mounting portion, a plurality of suspending leads integral with the chip mounting portion and each having a slit, a plurality of leads arranged around the chip mounting portion, and a plurality of common leads integral with the suspending leads and positioned between the chip mounting portion and the leads; mounting a semiconductor chip over the chip mounting portion, wherein the semiconductor chip has a main surface with a plurality of electrodes formed therein; coupling the electrodes of the semiconductor chip and the common leads electrically with each other through a plurality of wires for the common leads; coupling the electrodes of the semiconductor chip and the leads electrically with each other through a plurality of wires for the leads; and sealing the semiconductor chip, the chip mounting portion, the wires for the common leads and the wires for the leads with resin.

The following is a brief description of effects obtained by the typical mode of the present invention as disclosed herein.

Since bar-like common leads coupled to the suspending leads are arranged outside the chip mounting portion so as to surround the chip mounting portion and slits are formed in the common leads, even if an expanding or contracting action induced by the influence of heat is exerted on the common leads, the expanding or contracting action can be relieved by the slits and hence it is possible to diminish deflection (deformation) caused by expansion or contraction of the common leads.

Consequently, it is possible to prevent the occurrence of wire peeling and hence possible to effect wire bonding to the common leads. As a result, it is possible to implement the manufacture of a multi-pin semiconductor device using a lead frame.

Moreover, the use of a lead frame permits the reduction in cost of the semiconductor device.

Further, since deflection caused by expansion or contraction of the common leads can be diminished, it is possible to decrease the occurrence of wire shorting. As a result, it is possible to improve the reliability and quality of the semiconductor device.

BRIEF DESCRIPTION OF THE DRAWINGS

FIG. 5 is a sectional view showing an example of a manufacturing process after wiring bonding in assembling the semiconductor device shown in FIG. 1;

FIGS. 28(a), 28(b) and 28(c) shown the structure of a semiconductor device (QFN) according to another modification of the embodiment of the present invention, of which FIG. 28(a) is a plan view, FIG. 28(b) is a sectional view and FIG. 28(c) is a back view;

FIGS. 29(a), 29(b) and 29(c) show the structure of a semiconductor device (SOP) according to a further modification of the embodiment of the present invention, of which FIG. 29(a) is a plan view, FIG. 29(b) is a sectional view and FIG. 29(c) is a back view;

FIGS. 30(a), 30(b) and 30(c) show the structure of a semiconductor device (SON) according to a still further modification of the embodiment of the present invention, of which FIG. 30(a) is a plan view, FIG. 30(b) is a sectional view and FIG. 30(c) is a back view;

FIGS. 31(a), 31(b) and 31(c) show the structure of a semiconductor device (QFN) according to a still further modification of the embodiment of the present invention, of which FIG. 31(a) is a plan view, FIG. 31(b) is a sectional view and FIG. 31(c) is a back view; and FIGS. 32(a), 32(b) and 32(c) show the structure of a semiconductor device (SON) according to a still further modification of the embodiment of the present invention, of which FIG. 32(a) is a plan view, FIG. 32(b) is a sectional view and FIG. 32(c) is a back view.

DETAILED DESCRIPTION OF A PREFERRED EMBODIMENT

Figure 1:
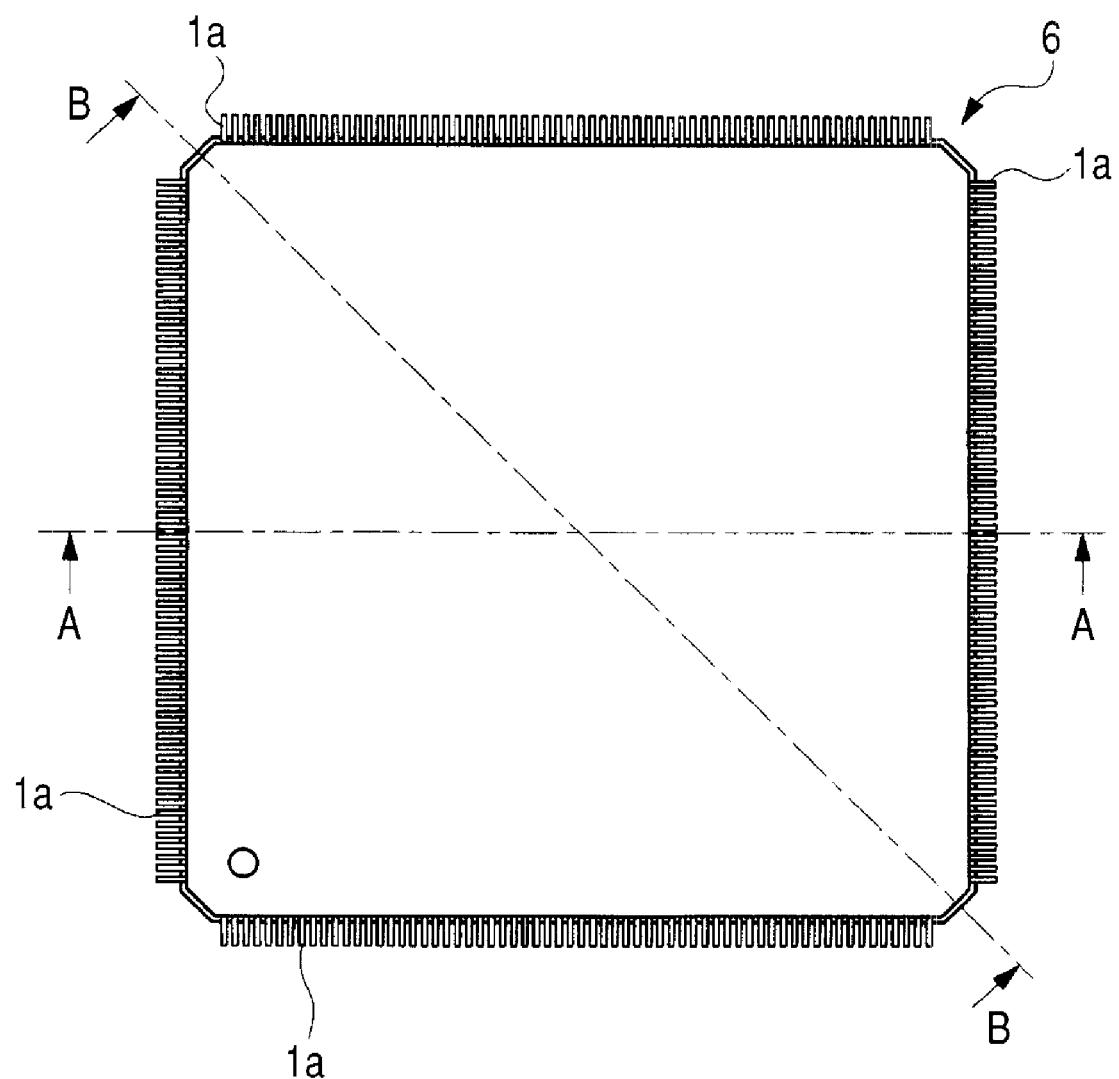
FIG. 1 is a plan view showing a structural example of a semiconductor device according to an embodiment of the present invention.

Where required for convenience sake, the following embodiment will be described in a divided manner into plural sections or embodiments, but unless otherwise mentioned, they are not unrelated to each other, but are in a relation such that one is a modification or a detailed or supplementary explanation of part or the whole of the other.

In the following embodiment, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

Further, it goes without saying that in the following embodiment the constituent elements (including constituent steps) are not always essential unless otherwise mentioned and except the case where they are considered essential basically obviously.

Likewise, it is to be understood that when reference is made to the shapes and a positional relation of constituent elements in the following embodiment, those substantially closely similar to or resembling such shapes, etc. are also included unless otherwise mentioned and except the case where a negative answer is evident basically. This is also true of the foregoing numerical value and range.

An embodiment of the present invention will be described below in detail with reference to the drawings. In all of the drawings for illustrating the embodiment, portions having the same functions are identified by like reference numerals and repeated explanations thereof will be omitted.

Embodiment

Figure 2:
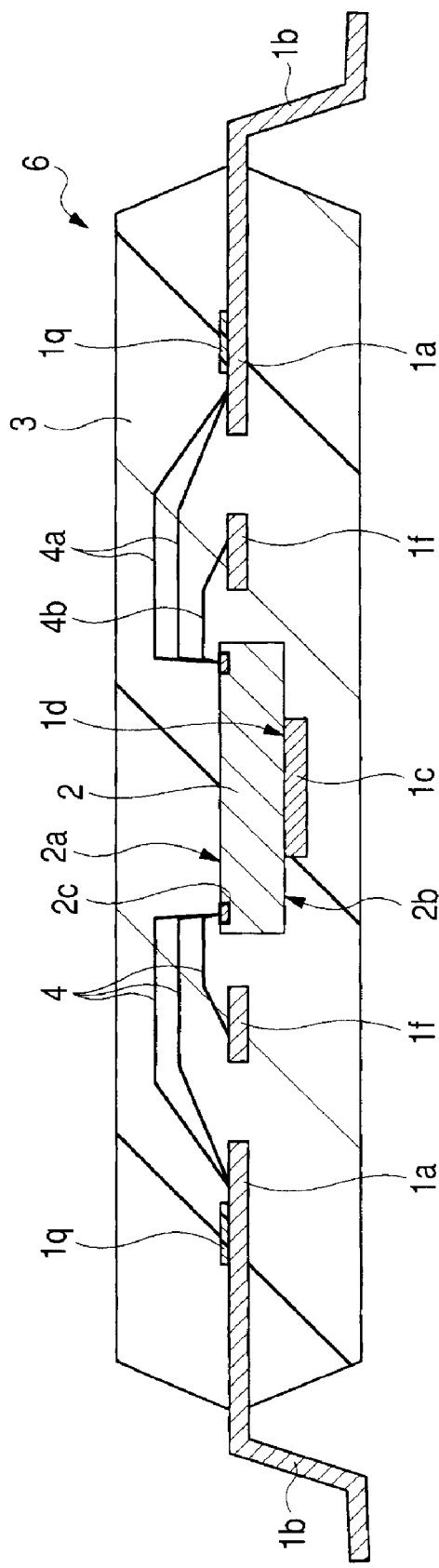
FIG. 2 is a sectional view showing a structural example taken along line A-A in FIG. 1.
Figure 3:
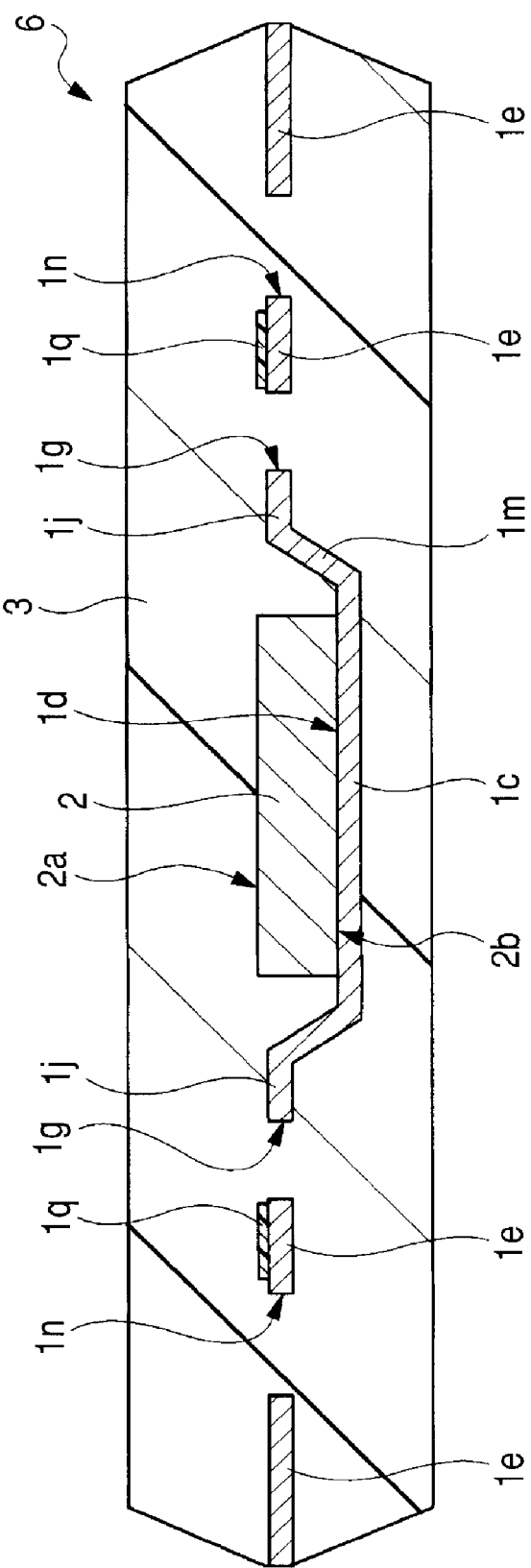
FIG. 3 is a sectional view showing a structural example taken along line B-B in FIG. 1.
Figure 4:
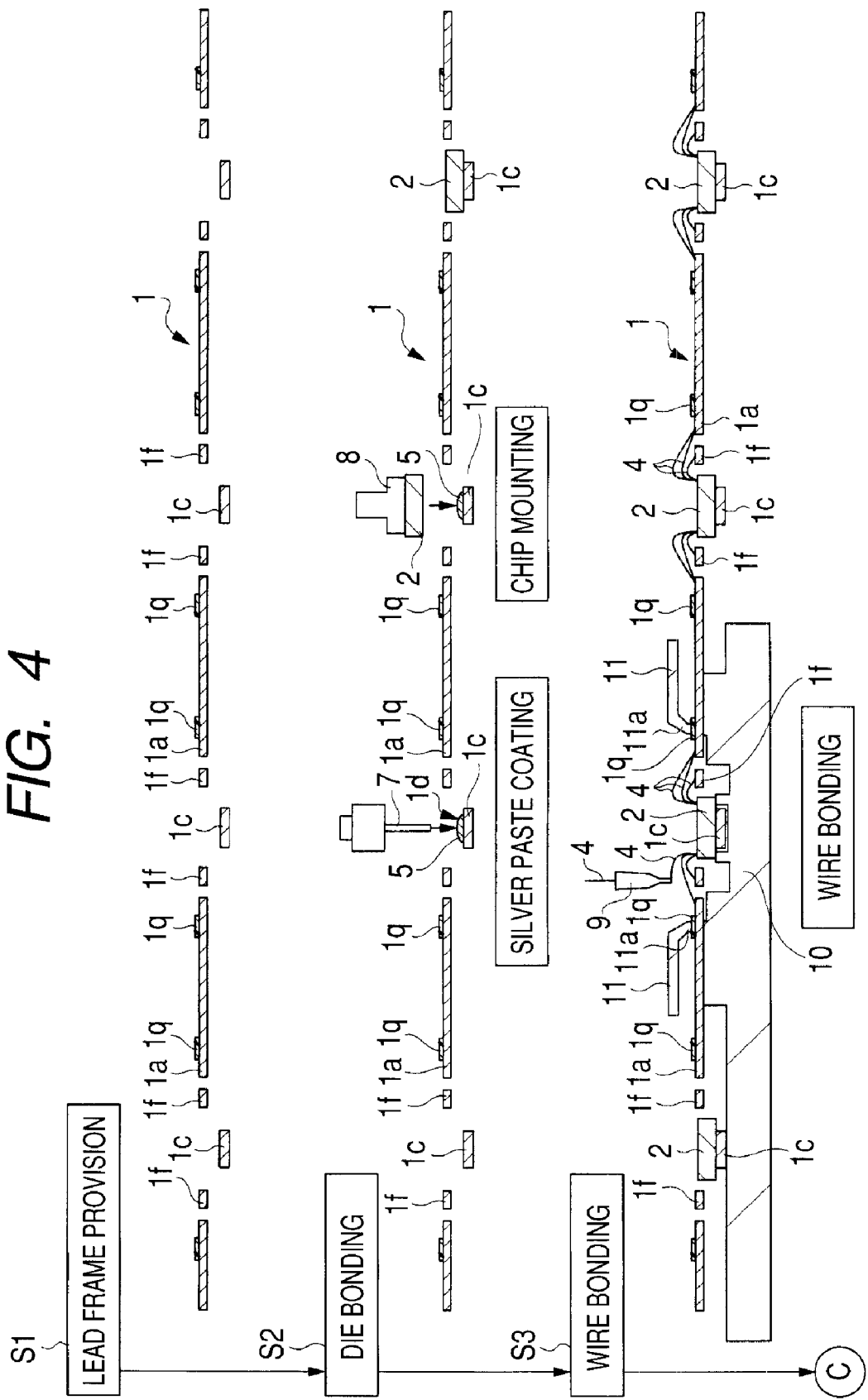
FIG. 4 is a sectional view showing an example of a manufacturing process up to completion of wire bonding in assembling the semiconductor device shown in FIG. 1.
Figure 6A:
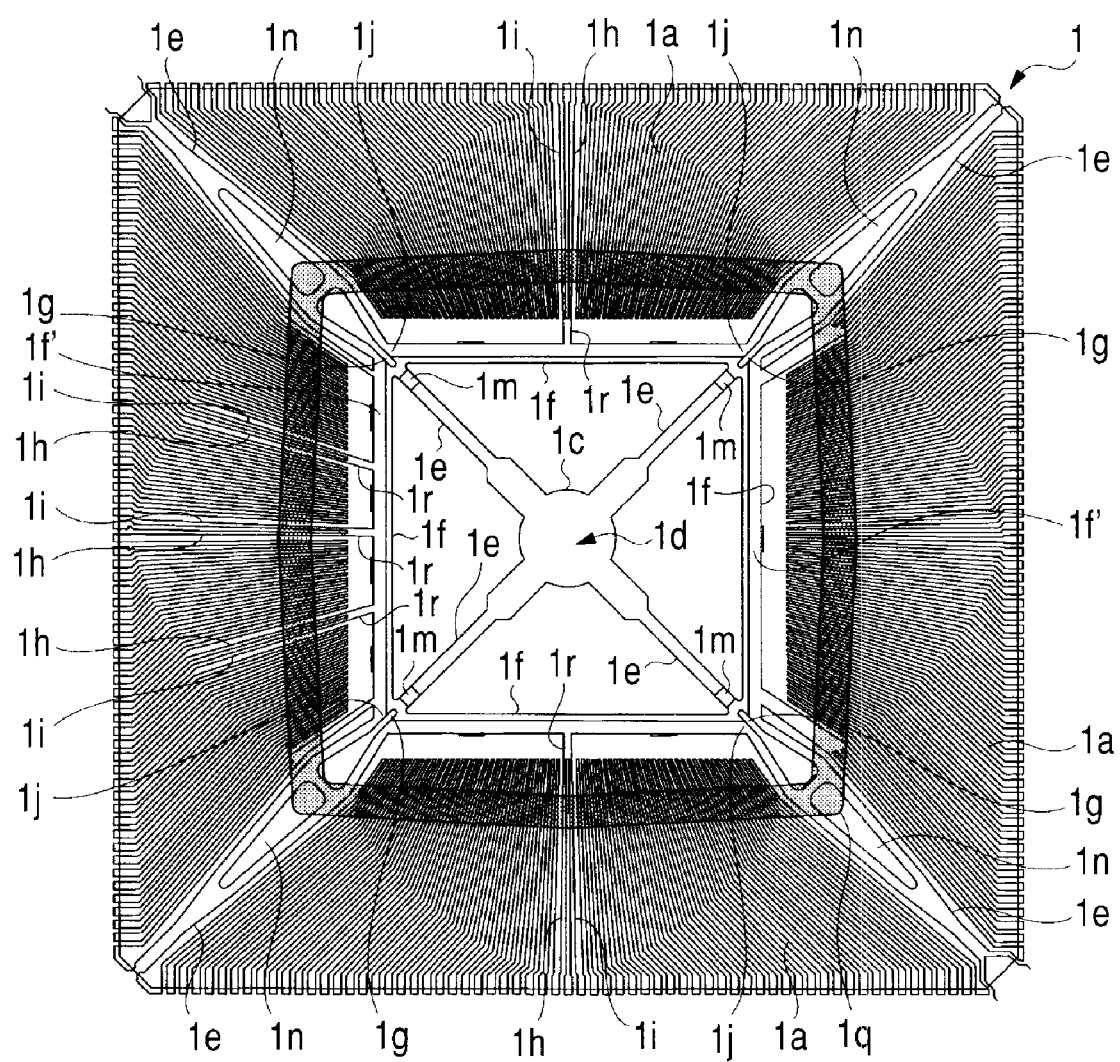
FIG. 6A is a partial plan view showing a structural example of a lead frame used in assembling the semiconductor device shown in FIG. 1.
Figure 6B:
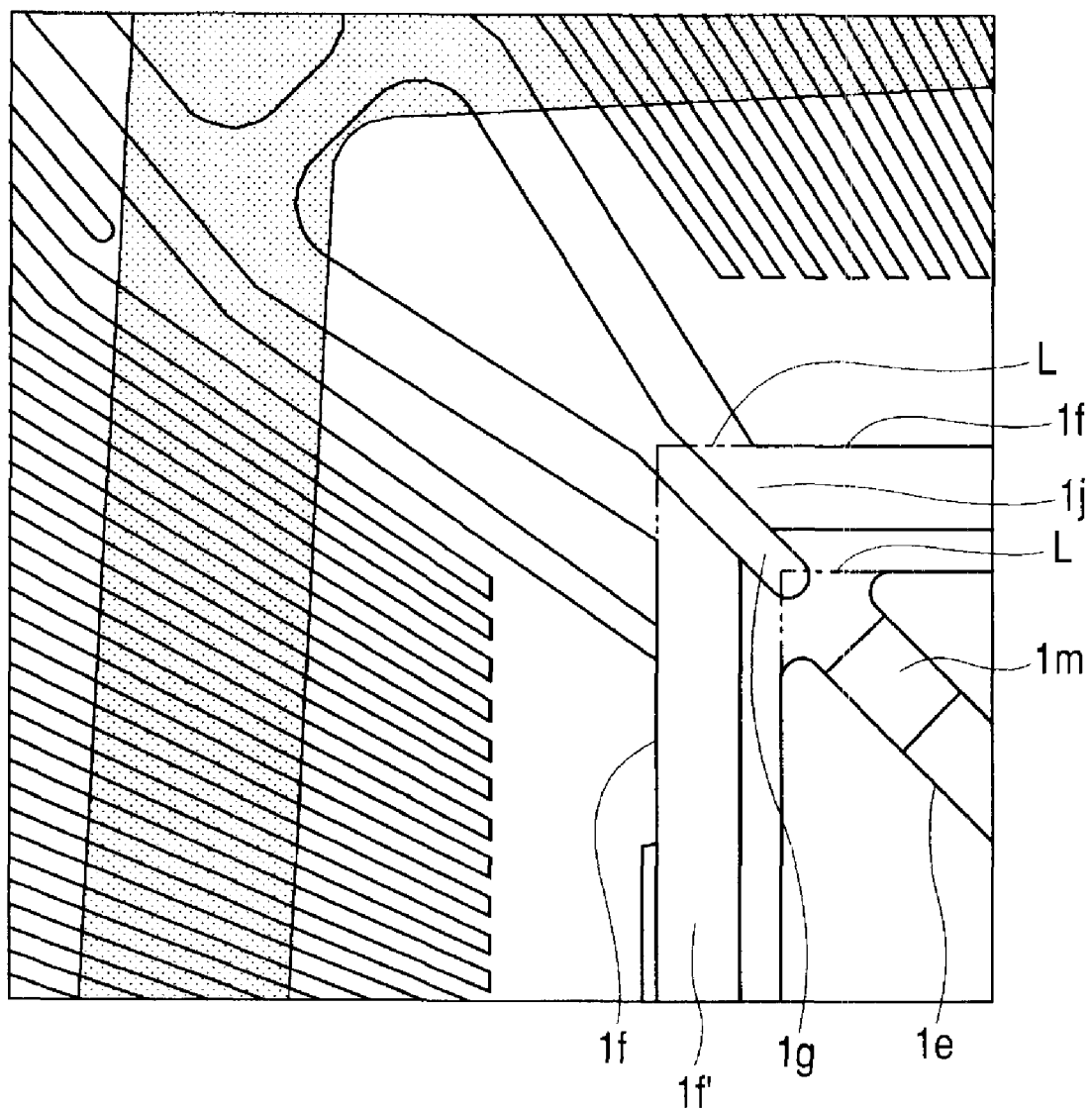
FIG. 6B is a partial enlarged plan view showing a part of the lead frame used in assembling the semiconductor device shown in FIG. 6A.
Figure 7:
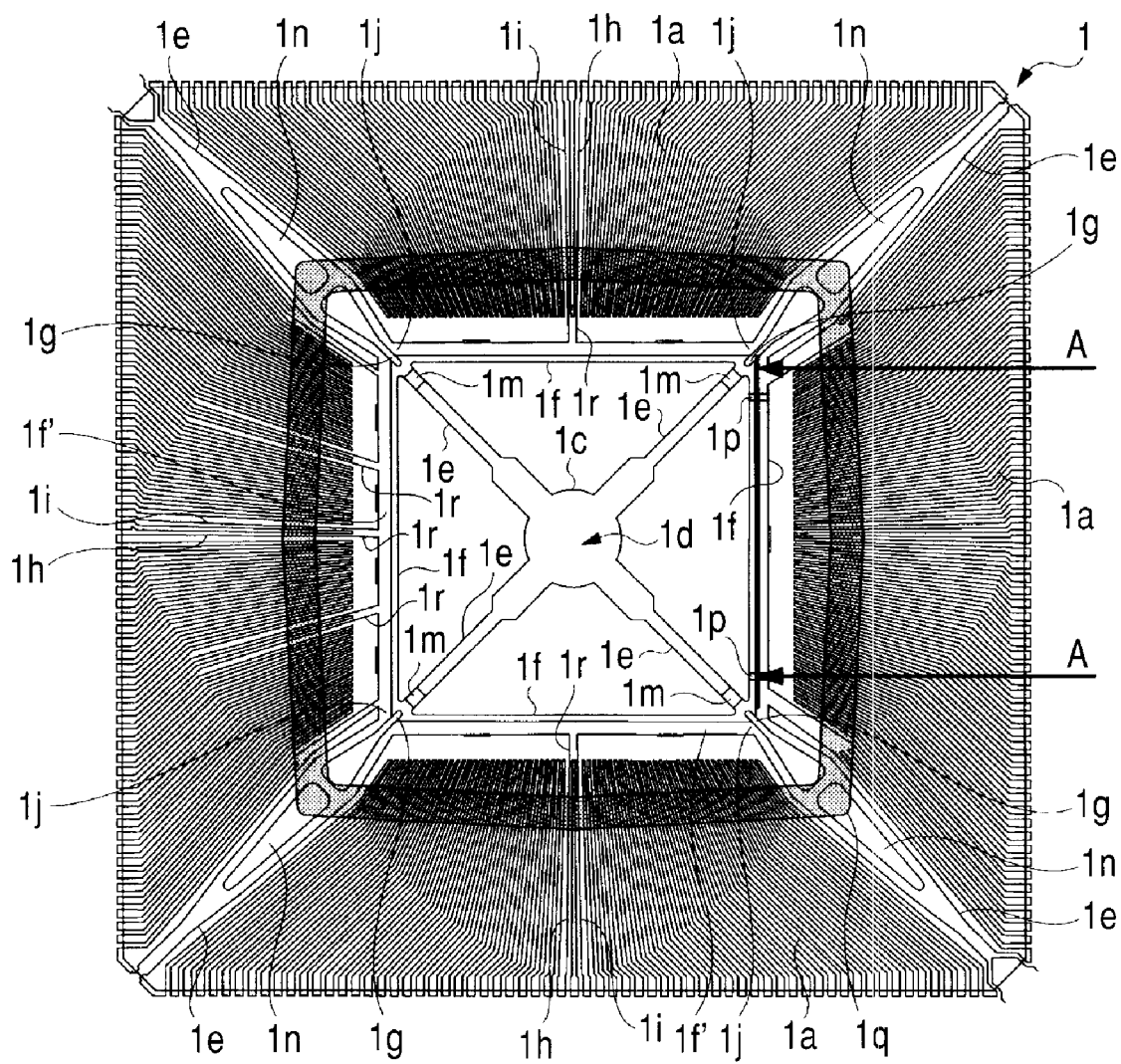
FIG. 7 is a partial plan view showing a structural example of second offset portions of the lead frame used in assembling the semiconductor device shown in FIG. 1.
Figure 8:
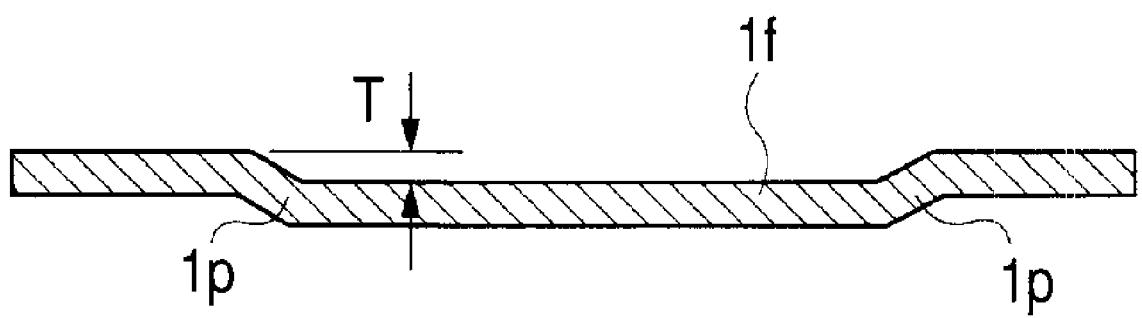
FIG. 8 is a sectional view showing a structural example taken along line A-A in FIG. 7.
Figure 9:
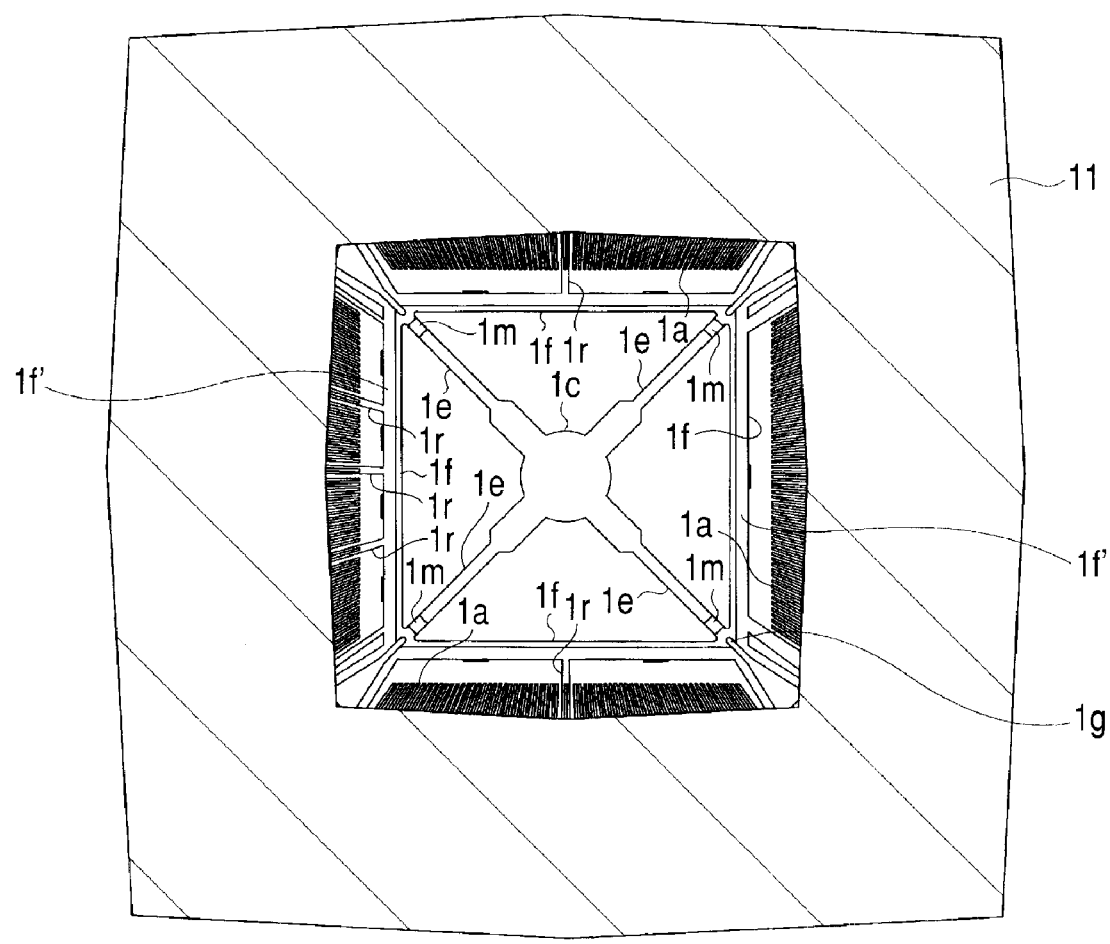
FIG. 9 is a plan view showing an example of a clamping area during wire bonding in assembling the semiconductor device shown in FIG. 1.
Figure 10:
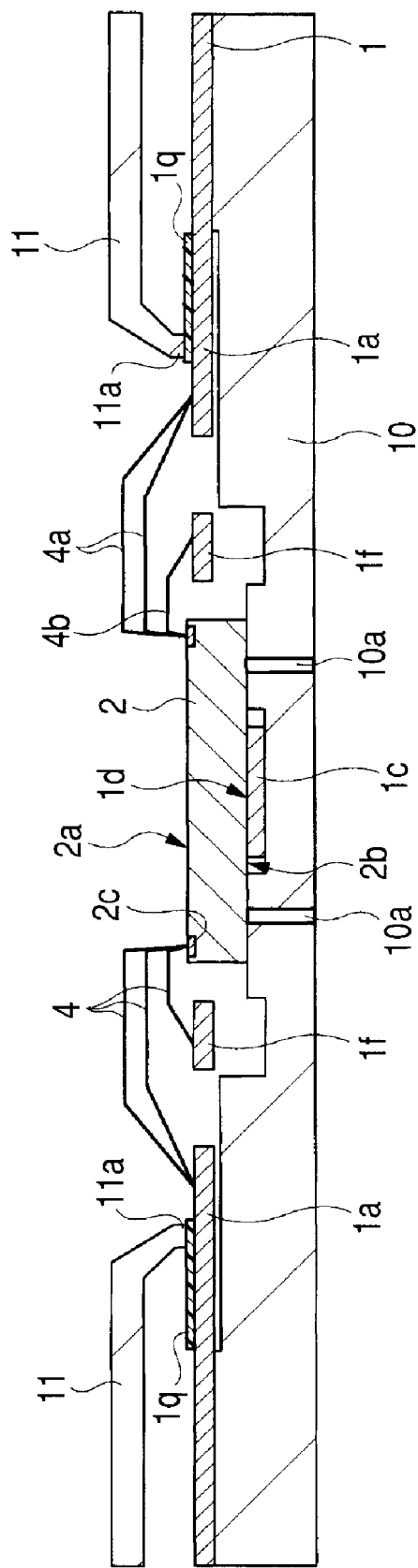
FIG. 10 is a sectional view showing an example of a clamp structure during wire bonding in assembling the semiconductor device shown in FIG. 1.
Figure 11:
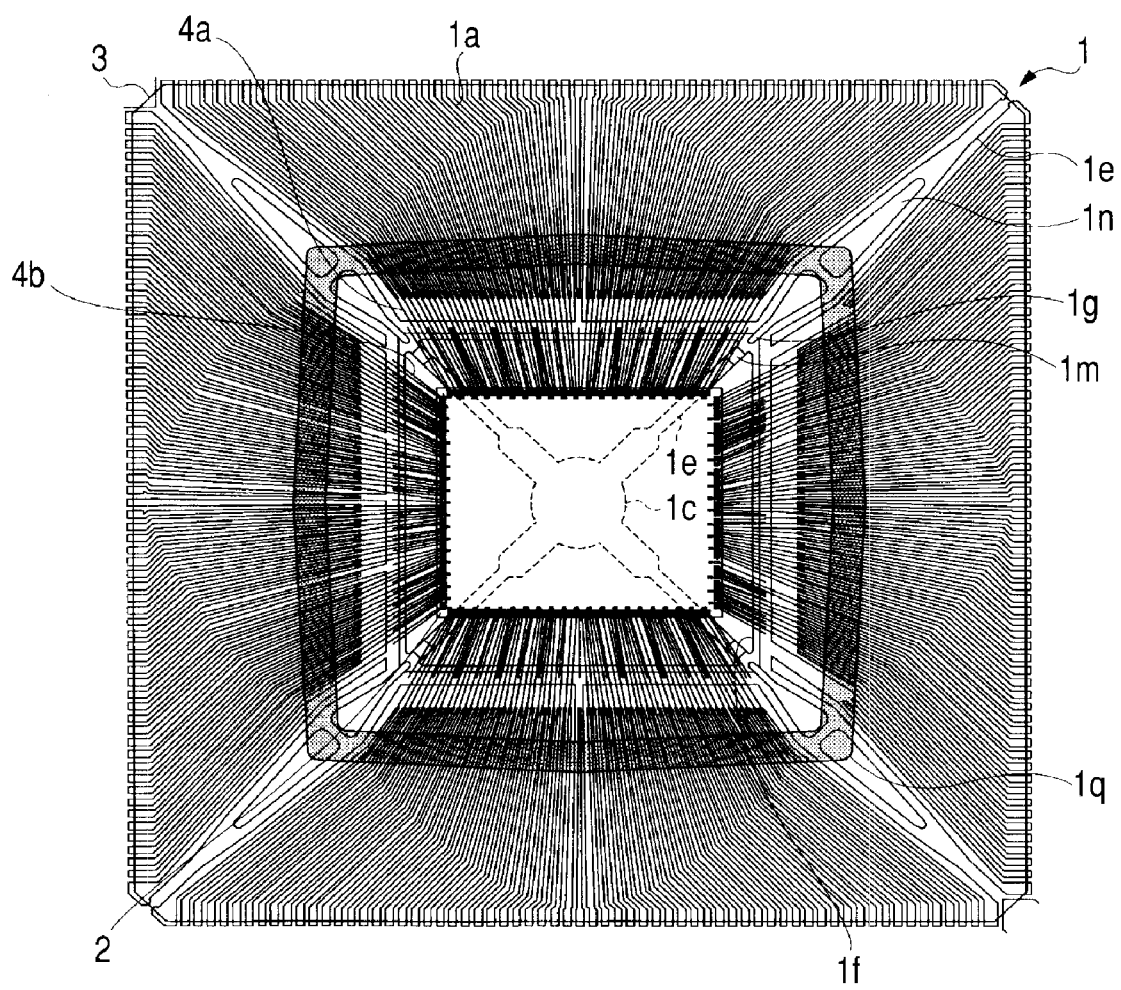
FIG. 11 is a partial plan view showing through a sealing body a structural example after resin molding in assembling the semiconductor device shown in FIG. 1.

FIG. 1 is a plan view showing a structural example of a semiconductor device according to an embodiment of the present invention, FIG. 2 is a sectional view showing a structural example taken along line A-A in FIG. 1, FIG. 3 is a sectional view showing a structural example taken along line B-B in FIG. 1, FIG. 4 is a sectional view showing an example of a manufacturing process up to completion of wire bonding in assembling the semiconductor device shown in FIG. 1, and FIG. 5 is a sectional view showing an example of a manufacturing process after wire bonding in assembling the semiconductor device shown in FIG. 1. FIG. 6A is a partial plan view showing a structural example of second offset portions of the lead frame used in assembling the semiconductor device shown in FIG. 1, FIG. 6B is a partial enlarged plan view showing a part of the lead frame used in assembling the semiconductor device shown in FIG. 6A, FIG. 7 is a partial plan view showing a structural example of second offset portions of the lead frame used in assembling the semiconductor device shown in FIG. 1, and FIG. 8 is a sectional view showing a structural example taken along line A-A in FIG. 7. FIG. 9 is a plan view showing an example of a clamping area during wire bonding in assembling the semiconductor device shown in FIG. 1, FIG. 10 is a sectional view showing an example of a clamp structure during wire bonding in assembling the semiconductor device shown in FIG. 1, and FIG. 11 is a partial plan view showing through a sealing body a structural example after resin molding in assembling the semiconductor device shown in FIG. 1.

Figure 12:
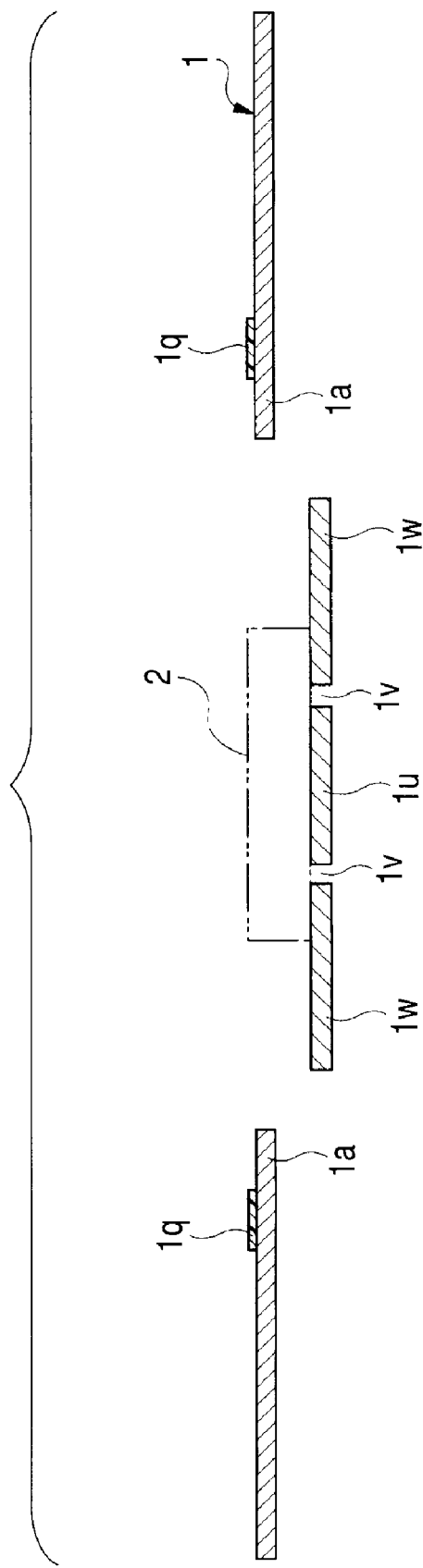
FIG. 12 is a sectional view showing the structure of a lead frame used in assembling a semiconductor device according to a modification of the embodiment of the present invention.
Figure 13:
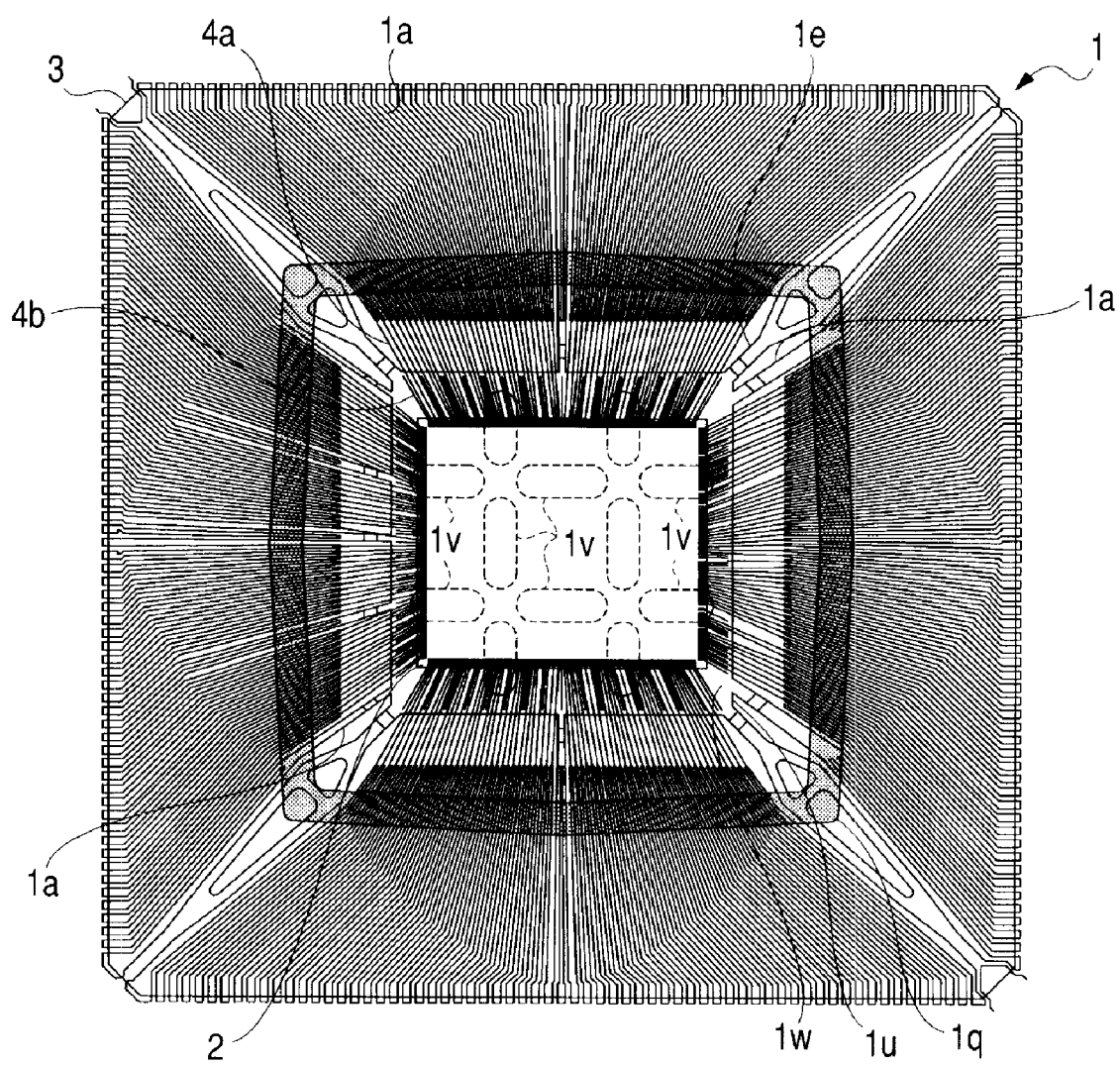
FIG. 13 is a partial plan view showing through a sealing body the structure after resin molding in assembling the semiconductor device according to the modification.
Figure 14:
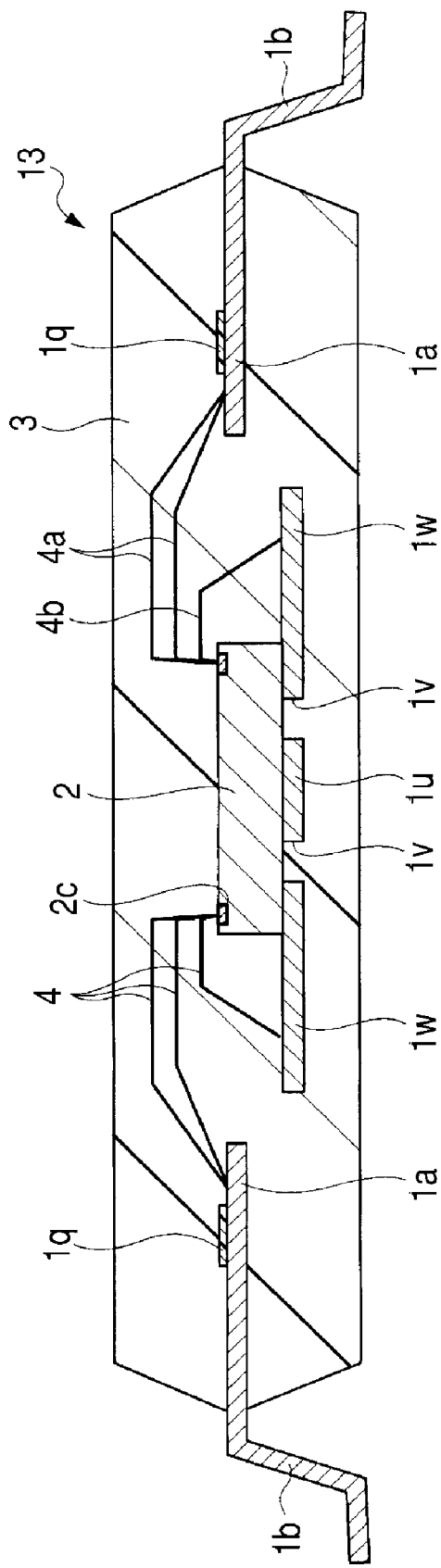
FIG. 14 is a sectional view showing the structure of the semiconductor device according to the modification.

FIG. 12 is a sectional view showing the structure of a lead frame used in assembling a semiconductor device according to a modification of the embodiment of the present invention, FIG. 13 is a partial plan view showing through a sealing body the structure after resin molding in assembling the semiconductor device according to the modification, and FIG. 14 is a sectional view showing the structure of the semiconductor device according to the modification.

The semiconductor device of the embodiment is a surface-mounted type assembled using a lead frame and having multiple pins and common leads to which are coupled power supply and GND. Reference will be made below to a QFP 6 as an example of the semiconductor device.

With reference to FIGS. 1 to 3, a description will now be given about the configuration of the semiconductor device (QFP 6). The QFP 6 comprises a tab (a chip mounting portion) 1c, plural leads arranged around the tab 1c, a semiconductor chip 2 mounted on a chip supporting surface 1d of the tab 1c, and plural suspending leads 1e for supporting the tab 1c, the chip supporting surface 1d of the tab 1c being capable of supporting the semiconductor chip 2 and having a dimension smaller than that of a back surface 2b of the semiconductor chip 2. The QFP 6 further includes bar-like common leads arranged outside the tab 1c so as to surround the tab and coupled to the suspending leads 1e, first wires 4a for coupling pads (electrodes) 2c of the semiconductor chip 2 and the leads with each other electrically, second wires 4b for coupling the pads 2c of the semiconductor chip 2 and the common leads with each other electrically, and a sealing body 3 which seals with resin the semiconductor chip 2 and the first and second wires 4a, 4b.

The configuration of the semiconductor device (QFP6) will now be described using another expression. The QFP 6 includes a chip mounting portion (tab, die pad) 1c having a chip supporting surface 1d capable of supporting a semiconductor chip 2. The chip supporting surface 1d has a dimension smaller than that of a back surface 2b of the semiconductor chip 2. The QFP 6 also includes plural suspending leads 1e formed integrally with the chip mounting portion 1c and formed with slits (first slits 1g) respectively. The QFP 6 further includes a semiconductor chip 2 mounted on the chip mounting portion 1c and having a main surface 2a with plural pads (electrodes) 2c formed thereon. The QFP 6 further includes plural leads (inner leads 1a) arranged around the semiconductor chip 2. The QFP 6 further includes plural bar-like common leads (bus bar leads, bar leads) 1f formed integrally with the suspending leads 1e respectively and positioned between the chip mounting portion 1c and the leads (inner leads 1a). The QFP 6 further includes plural wires (first wires 4a, lead wires) 4 for electrically coupling the electrodes 2c of the semiconductor chip 2 and the leads (inner lead 1a) with each other. The QFP 6 further includes wires (second wires 4b, common lead wires) 4 for electrically coupling electrodes 2a of the semiconductor chip 2 and the bar-like common leads 1f with each other. The QFP further includes a sealing body 3 for sealing the semiconductor 2, chip mounting portion 1c and wires (first wires 4a, second wires 4b) 4. The QFP 6 further includes plural outer leads 1b formed integrally with the leads (inner leads 1a) respectively and exposed from the sealing body 3.

The leads each comprise an inner lead 1a embedded in the interior of the sealing body 3 and an outer lead 1b as an external terminal exposed to the exterior of the sealing body 3, the outer lead 1b being bent in a gull wing shape. The inner lead 1a and the outer lead 1b are integrally coupled with each other.

In the QFP 6, as shown in FIGS. 6A and 6B, bar leads 1f as elongated bar-like common leads are arranged between the tab 1c and front ends of the inner leads 1a.

The slits (through holes, holes) used in this embodiment indicate a partially excluded configuration of the lead frame (suspending leads 1e) 1. This is effective in mitigating the stress imposed on the lead frame 1.

In this embodiment, the bar-like common leads (bar leads) 1f are each formed so as to be smaller in width than the width (the total width including both first and second slits 1g, in) of each suspending lead 1e. Therefore, the length of each first wire 4a for coupling each pad (electrode) 2c of the semiconductor chip 2 with the corresponding inner lead 1a electrically can be made smaller than in case of the width of each common lead 1f being larger than the width of each suspending lead 1e. As a result, it is possible to attain a high signal propagation speed. Moreover, it is possible to suppress a wire shorting defect which is caused by flowing of the wires with resin in the resins sealing process.

The bar leads 1f are each a lead which permits coupling thereto of plural wires 4 on the pads 2c and thereby permits using a power supply and GND in common. Both end portions of each bar lead (common lead, bus bar lead) 1f are formed integrally with adjacent suspending leads 1e. Therefore, in the semiconductor chip 2 which requires a large number of pads for power supply and GND for the purpose of improving electrical characteristics, signals provided from increased pads such as power supply or GND can be made common within the package, whereby the number of leads (inner and outer leads) can be decreased in comparison with the number of pads. Thus, the bar leads 1f are very effective as means for suppressing an increase of the package size.

In the QFP 6, four bar leads 1f are provided correspondingly to the four sides of the semiconductor chip 2. In each side of the chip, the associated bar lead 1f extends in the direction of arrangement of the front ends of the inner leads 1a and both ends thereof are coupled to adjacent suspending leads 1e arranged in diagonal directions of a main surface 2a of the semiconductor chip 2. Thus, the bar leads 1f are formed in the shape of a quadrangular frame around the tab 1c.

Since the bar leads 1f are formed in a quadrangular frame shape, the power supply or GND wires 4 can be coupled in four directions. Moreover, the flow balance of the molding resin in four directions can be made substantially uniform.

In the QFP 6, as shown in FIGS. 6A and 6B, a first slit 1g is formed in each bar lead 1f. More specifically, first slits 1g are formed respectively in first coupling portions 1j for coupling between the bar leads 1f and the suspending leads 1e.

The suspending leads 1e are formed with plural slits (first slits 1g and second slits in) as means for mitigating stress. A detailed description will now be given about the first slits 1g. As shown in FIG. 6B, each first slit 1g is formed so as to extent up to the portion of the associated suspending lead 1e to which end portions of common leads (bar leads, bus bar leads) 1f are coupled. In other words, each slit (first slit 1g) as stress mitigating means is formed on extension lines of common leads 1f indicated by dash-double dot lines (phantom lines) in FIG. 6B in the associated suspending lead 1e.

The slits (through holes, holes) formed in this embodiment are of a structure obtained by cutting out the suspending leads 1e partially. More specifically, as shown in FIG. 3, the slits are through holes (holes) extending from a main surface (the same side as the main surface 2a of the semiconductor chip 2) toward a back surface (the same side as the back surface 2b of the semiconductor chip 2) of each suspending lead 1e.

Thus, the bar leads 1f coupled to the suspending leads 1e are arranged outside the tab 1c so as to surround the tab and the first slits 1g are formed in the first coupling portions 1j between the bard leads 1f and the suspending leads 1e. Therefore, even if an expanding or contracting (thermal strain) action caused by the influence of heat is exerted on the bar leads 1f, it can be relieved by the presence of the first slits 1g.

In short, even if the common leads expand under the influence of heat of a heated bonding stage 10 in the wire bonding process, since slits (first slits 1g) are formed respectively in the portions, to which end portions of the common leads (bar leads, bus bar leads) 1f are coupled, of the suspending lead 1e, the suspending leads 1e are deformed and not prevented from expansion.

Consequently, it is possible to diminish deformation of the bar leads 1f and hence also possible to diminish fluctuation of the tab 1c to which the bar leads are coupled through the suspending leads 1e.

A ring-like thin film tape 1q for preventing flapping and deformation of the inner leads 1a is affixed to outsides of wire bonding areas at the front ends of the inner leads 1a.

The QFP 6 of this embodiment is of a small tab structure (the tab 1c is smaller than the dimension of the semiconductor chip 2), so that not only the size of the semiconductor chip 2 to be mounted can be given versatility, but also it is possible to improve the resistance to reflow.

The QFP 6 is assembled using a lead frame (see FIGS. 6A and 6B) formed of a copper alloy for example. Therefore, the tab 1c, inner leads 1a, outer leads 1b, four suspending leads 1e and bar leads 1f are formed of the copper alloy. The inner leads 1a and the four bar leads 1f are plated with silver in their areas to which the wires 4 are conned, to form plating films (plating layers) 1f'.

Since a plating film (plating layer) 1f' is formed, it is possible to improve the coupling ability between the wires 4 formed of gold and the inner leads 1a formed of copper. A front end portion (a portion to which the wire 4 is coupled) of each inner lead 1a is also plated with silver and is thus formed with a plating film (plating layer) 1f'.

The semiconductor chip 2 is formed of silicon for example and plural pads 2c serving as electrodes are formed on the main surface 2a thereof. The back surface 2b of the semiconductor chip 2 is bonded to the tab 1c through a die bonding material. Thus, the semiconductor chip 2 is supported by the tab 1c.

Wires 4 including the first wires 4a and the second wires 4b are, for example, gold wires. The sealing resin which forms the sealing body 3 is, for example, a thermosetting epoxy resin. Other characteristic portions of the QFP 6 will be described below.

In the QFP 6, as shown in FIGS. 3, 6A and 6B, first offset portions 1m are formed by bending at positions inside the first coupling portions 1j between the four suspending leads 1e and the bar leads 1f.

With the first offset portions 1m, it is possible to prevent a change in location (position) of the tab 1c caused by a thermal strain or thermal deformation of the bard leads 1f. That is, even if there occurs a thermal strain or thermal deformation of the bar leads 1f, the influence thereof is relieved and absorbed by the first offset portions 1m and is therefore not transmitted to the tab 1c, whereby it is possible to prevent a change in location of the tab 1c.

Moreover, with the first offset portions 1m, versatility can be imparted to semiconductor devices different in chip thickness, namely, having semiconductor chips 2 of different thicknesses. More specifically, by adjusting the offset quantity of the first offset portions 1m it is possible to adjust the amount of resin present above the semiconductor chip 2 and that below the chip and thus it becomes possible to adjust the resin balance.

Figure 15:
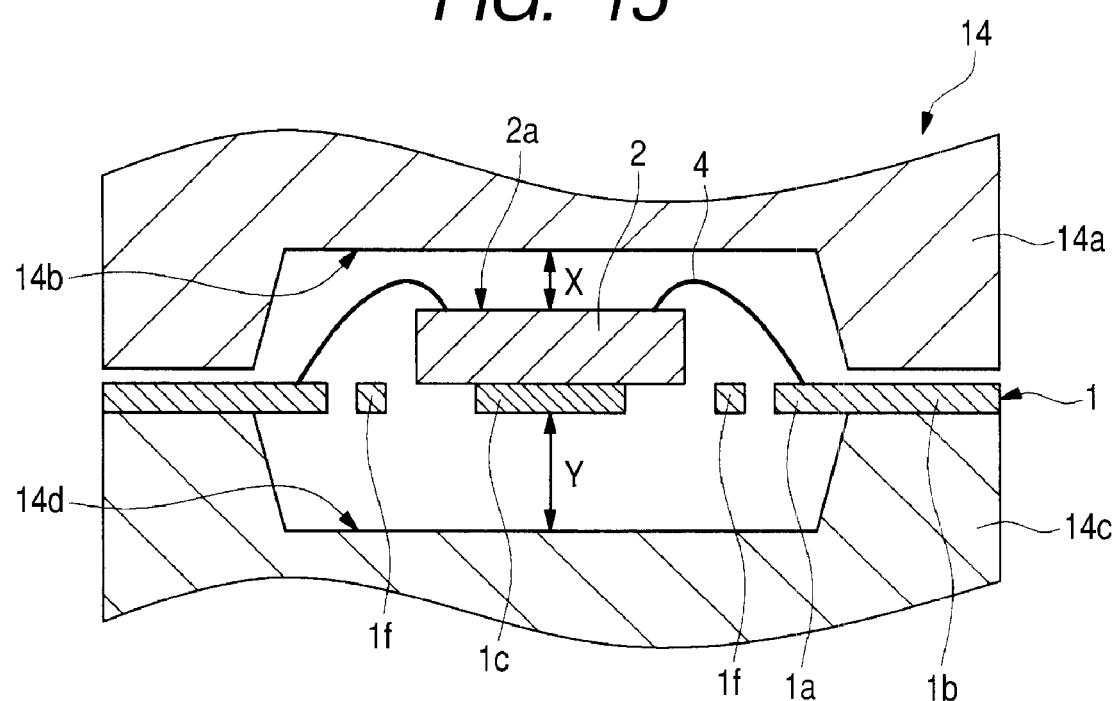
FIG. 15 is a partial sectional view showing a structural example in mold clamping with a mold in case of using an offset-free lead frame in the embodiment of the present invention.

A positional relation between the offset portions 1m and common leads (bar leads, bus bar leads) 1f will now be described in detail. FIG. 15 is a partial sectional view showing a structural example in mold clamping with a mold in case of using an offset-free lead frame in the embodiment of the present invention.

First, in case of using a lead frame 1 with first offset portions 1m not formed in the suspending leads 1e, as shown in FIG. 15, the spacing X from a cavity surface 14b of an upper mold 14a in a molding die 14 (a resin molding die) to the main surface 2a of the semiconductor chip 2 is narrower than the spacing Y from a cavity surface 14d of a lower mold 14c in the molding die 14 (a resin molding die) to a back surface of the tab 1c.

Consequently, in the resin sealing process, the amount of resin lapping on the back surface side of the tab 1c becomes larger than that of the resin lapping onto the main surface 2a of the semiconductor chip 2, thus causing variations in resin balance. With the variations in resin balance, the tab 1c which carries the semiconductor chip 2 thereon is pushed up, giving rise to a problem such as the wires 4 being partially exposed from an upper surface of the sealing body 3 or breaking of the wires 4.

In this embodiment, to solve the above-mentioned problem, as shown in FIGS. 3, 6A and 6B, first offset portions 1m are formed in the suspending leads 1e respectively. In short, the first offset portions 1m are each formed by bending the associated suspending lead 1e from the main surface toward the back surface of the same lead. With the first offset portion 1m, it is possible to make the resin balance almost uniform.

In this embodiment, the first offset portions 1m are each formed on the tab 1c side with respect to the portion to which end portions of common leads 1f are coupled, of the associated suspending lead. Since the first offset portions 1m are formed between the tab 1c and the common leads if, even if the common leads 1f undergo a thermal strain or a thermal deformation, the influence thereof is mitigated and absorbed by the first offset portions 1m and is therefore difficult to be transmitted to the tab 1c. Consequently, it is possible to suppress a change in location (position) of the tab 1c.

The offset quantity of each first offset portion 1m is, say, 0.24 mm.

As shown in FIGS. 6A and 6B, the QFP 6 has, out of the inner leads 1a, plural inner leads 1a coupled to the bar leads 1f. The inner leads 1a coupled to the bar leads 1f each include a first inner lead 1h, a second inner lead 1i adjacent to the first inner lead 1h, and a second coupling portion 1r for coupling between the first inner lead 1h and the second inner lead 1i at the end portion on the bar lead 1f side.

Thus, the inner leads 1a coupled to the bar leads 1f each comprise the first inner lead 1h, the second inner lead 1i and the second coupling portion 1r, the second coupling portion 1r being arranged between the bard lead 1f-side front ends of the first and second inner leads 1h, 1i and the associated bar lead 1f.

Since the second coupling portion 1r for coupling between the first and second inner leads 1h, 1i is arranged between the bar lead 1f-side front ends of the inner leads 1a and the associated bar lead 1f, although the front ends of the inner leads 1a configure a convergent area, it is possible to ensure rigidity of the front end side of the first and second inner leads 1h, 1i.

As shown in FIGS. 6A and 6B, outer ends (outer lead-side ends) of the first and second inner leads 1h, 1i are branched from each other, with no such coupling as on the bar lead 1f side.

Consequently, in the resin molding process, the fluidity (flow velocity) of the molding resin passing the area where the first and second inner leads 1h, 1i are formed and that of the molding resin passing the area where the other inner leads 1a are formed can be made almost equal to each other. That is, the molding resin flows between the branched first and second inner leads 1h, 1i substantially uniformly together with the molding resin flowing between the other inner leads 1a, whereby the molding resin fluidity can be made substantially uniform. As a result, it is possible to prevent wire deformation, deformation of the tab 1c and the formation of voids.

As shown in FIGS. 3, 6A and 6B, second slits 1n are formed in the four suspending leads 1e respectively at positions outside the first coupling portions 1j for coupling with the bar leads 1f. With the second slits 1n, the flow velocity of the molding resin in resin injection can be made uniform and it is thereby possible to prevent wire deformation, deformation of the tab 1c and the formation of voids.

To be more specific, the four suspending leads 1e are provided for supporting the tab 1c. However, in the case where the dimension of the tab 1c is smaller than that of the semiconductor chip 2 (small tab structure) as in this embodiment, the length of each suspending lead 1e is larger in comparison with the case where the dimension (size) of the tab 1c is larger than that of the semiconductor chip 2 (large tab structure). If the shape of each suspending lead 1e is merely elongated, then in the resin sealing process, there occurs a deflection of the suspending lead 1e due to the injection pressure of the resin, thus causing a change in location (position) of the tab.

To avoid the occurrence of such an inconvenience, as shown in FIGS. 6A and 6B, the suspending leads 1e are each formed so as to be larger in width, thereby improving the rigidity of the suspending lead. Further, as shown in FIGS. 3, 6A and 6B, a second slit (through hole, hole) 1n is formed in each suspending lead 1e. This is for the following reason.

The lead frame 1 used in this embodiment is, for example, a thin plate formed of copper alloy and the adherence between the lead frame 1 and the molding resin (sealing body 3, resin) is lower than that between the semiconductor chip 2 and the molding resin. Therefore, if the suspending leads 1e are merely formed large in width, there occurs peeling at the interface between the sealing body 3 formed in the resin sealing process and the lead frame (especially the suspending leads 1e), with the result that the reliability of the semiconductor device is deteriorated. If a slit (second slit 1n) is formed in each suspending lead 1e, the resin formed within the slit displays an anchoring effect, whereby the adherence between the sealing body 3 and the lead frame (suspending leads 1e) can be improved. Moreover, by forming such slits in the suspending leads 1e, the density of leads near the side of the semiconductor chip 2 having a square plane shape and the density of leads near the corners of the semiconductor chip can be made almost uniform. Consequently, the flow velocity of resin flowing near the suspending leads 1e and that of resin flowing near the leads (inner leads 1a) can be made almost uniform. Thus, a significant difference does not occur between both flow velocities and it is possible to suppress the deterioration of resin balance.

If attention is paid to only the suppression of deterioration in resin balance described above, only one slit larger than the slits (first slit 1g, second slit 1n) shown in FIG. 6A may be formed in each suspending lead 1e. However, in the case where the dimension of the tab 1c is smaller than that of the semiconductor chip 2 as in this embodiment, the length of each suspending lead 1e becomes larger than that in the large tab structure. Therefore, in the lead frame 1 of such a small tab structure, if one large slit is formed in each suspending lead 1e, the rigidity of the suspending lead 1e is likely to be deteriorated. In this connection, by forming plural slits in each suspending lead 1e as in FIG. 6A, it is possible to suppress the deterioration in rigidity of the suspending lead 1e.

The slits (first slit 1g, second slit 1n) have respective widths larger than the widths of the divided portions of each suspending lead 1e divided by the slits. Consequently, the shapes of the divided portions of each suspending lead 1e can be conformed with the shape of adjacent inner leads 1a. As a result, it is possible to suppress a great change in flow velocity of the resin flowing from the inner leads 1a toward the suspending lead 1e (or from the suspending lead 1e to the inner leads 1a).

The surfaces of the bar leads 1f are plated with silver for pressure-bonding the wires 4, whereby plating films (plating layers) 1f' are formed. The plating films (plating layers) 1f' are not formed throughout the whole surfaces of the bar leads 1f, but are formed partially (for example the outer portions of the bar leads 1f in FIGS. 6A and 6B). The adhesion of the silver plating to the molding resin is low, but by forming the plating films 1f' not on the whole surfaces of the bar leads 1f but on only the areas to which the wires 4 are coupled, as shown in FIGS. 6A and 6B, it is possible to improve the adhesion between the molding resin and the bar leads 1f and hence possible to improve the reliability and quality of the semiconductor device.

More particularly, the adherence between silver plating and molding resin is lower than the adherence between the lead frame 1 formed of copper alloy and the molding resin, but by forming the plating film in only the area to which the wires 4 are coupled, it is possible to suppress the deterioration in adherence between the molding resin and the lead frame (common leads 1f).

As shown in FIG. 7, such second offset portions 1p as shown in FIG. 8 are formed in the bar lead f not coupled to the front ends of inner leads 1a except at both ends of the bar lead, out of the four bar leads 1f arranged in a quadrangular frame shape.

The second offset portions 1p serve as strain relief portions when the inner leads 1a are clamped by a damper 11 (see FIGS. 4 and 10) during wire bonding. More specifically, during wire bonding, as shown in FIG. 9, the bar leads 1f are not clamped by the damper 11, but only the inner leads 1a are clamped. When the inner leads 1a are clamped, the bar leads 1f coupled to the inner leads 1a out of the four bar leads 1f are difficult to be influenced by strain. As a result, strain concentrates on the bar lead 1f not coupled to the inner leads 1a, causing deformation of the bar lead 1f, with consequent floating of the bar lead 1f from a bonding state 10 shown in FIG. 10.

As a countermeasure to such floating of the bar lead 1f, such an offset work as shown in FIG. 8 is performed for the bar lead 1f not coupled to the inner leads 1a at any other portion than both ends, whereby this bar lead 1f can be brought into close contact with the bonding stage 10 during wire bonding. That is, it is possible to ensure adhesion between the bar lead 1f and the bonding stage 10.

For example, it is preferable that the offset work be applied to the bar lead 1f in an area of the bar lead not coupled to the inner lead 1a to form the second offset portions 1p. In the example shown in FIG. 7, the second offset portions 1p are formed at somewhat inside positions near both ends of the bar lead 1f.

In the QFP 6 of this embodiment, the bar lead 1f not coupled to the front ends of the inner leads 1a at any other portion than both ends is one of the four bar leads 1f.

The offset quantity (T) of each second offset portion 1p of the bar lead 1f shown in FIG. 8 is, for example, about 0.05 mm capable of being attained by coining. Thus, the offset quantity (0.05 mm) of each second offset portion of the bar lead 1f is much smaller than the offset quantity (0.24 mm) of the first offset portion 1m of each suspending lead 1e.

In the QFP 6, the inner leads 1a in the area of each bar lead 1f not coupled to the inner lead 1a are a group of leads for signals and a group of leads coupled to the exterior are arranged in this area. In this area, therefore, it is difficult to effect coupling between the bar leads 1f and the inner leads 1a.

In the QFP 6, as shown in FIG. 2, adjacent wires 4 coupled to adjacent inner leads 1a or adjacent wires 4 coupled to a bar lead 1f and an inner lead 1a are different in loop height. More particularly, in the QFP 6, since wires 4 (first wires 4a) are coupled to inner leads 1a beyond each bar lead 1f, the wire length becomes large and a wire touch defect is apt to occur.

The occurrence of the wire touch defect can be prevented by changing the loop height between adjacent wires.

Next, with reference to process flow charts of FIGS. 4 and 5, a description will be given below about assembling the QFP 6 of this embodiment.

First, in FIG. 4, a lead frame 1 is provided in step S1. The lead frame 1 is of such a configuration as shown in FIGS. 6A and 6B.

As shown in the same figure, four bar leads (common leads) 1f are arranged around a small tab 1c and are coupled at respective both ends to suspending leads 1e, with first slits 1g being formed respectively in first coupling portions 1j for coupling with the suspending leads 1e.

More specifically, as shown in FIGS. 6A and 6B, a lead frame 1 is provided which includes a chip mounting portion (tab, die pad) 1c, plural suspending leads 1e formed integrally with the chip mounting portion 1c and having slits (first slits 1g) respectively, plural leads (inner leads 1a) arranged around the chip mounting portion 1c, and plural common leads (bar leads, bus bar leads) 1f each positioned between the chip mounting portion 1c and the leads (inner leads 1a) and formed integrally with the suspending leads 1e.

The slits (first slits 1g) as stress mitigating means are formed in portions, to which the end portions of the common leads 1f are coupled, of the suspending leads 1e. In other words, in the suspending leads 1e, the slits (firs slits 1g) as stress mitigating means are formed respectively on extension lines of the common leads 1f indicated by broken lines (phantom lines) in FIG. 6B.

Outside wire bonding portions of the inner leads 1a, a ring-like tape 1q is affixed onto the inner leads 1a.

Three out of the four leads 1f are each coupled to plural inner leads 1a through a second coupling portion(s) 1r not at both ends but in the vicinity of the center. The remaining one bar lead 1f is not centrally coupled to any inner lead 1a. Such second offset portions 1p as shown in FIG. 8 are formed in the bar lead 1f not centrally coupled to any inner lead 1a.

Plural inner leads 1a whose bar lead 1f-side ends are coupled to the associated bard lead 1f through the second coupling portion(s) 1r are branched at their ends on the side opposite to the bar lead 1f.

The suspending leads 1e are respectively formed with first offset portions 1m inside the first coupling portions 1j for coupling with the bar leads 1f.

The lead frame 1 is a sheet member formed of a copper alloy for example.

Thereafter, die bonding is performed in step S2 in FIG. 4. First, silver paste 5 is applied onto the tab 1c from a potting nozzle 7. Then, the semiconductor chip 2 is conveyed onto the tab 1c while chucking the main surface 2a of the chip by a chucking collet 8 and is fixed to the tab 1c through the silver paste 5. As shown in FIGS. 6A and 6B, the first offset portions 1m are formed inside (on the tab 1c side) the first coupling portions 1j for coupling with the bar leads 1f, so if there is used such a pyramidal collet as holds the outer edges of the semiconductor chip 2 when mounting the semiconductor chip 2 of a relatively large size onto the tab 1c, there is a fear that a part of the collet may contact the first offset portions 1m.

However, if such a chucking collet 8 as in this embodiment is used, the semiconductor chip 2 can be conveyed by holding only the main surface 2a of the chip, so that even when the collet 8 is brought down for mounting the semiconductor chip 2 onto the tab 1c, there is no fear of contact of a part of the collet with the first offset portions 1m.

Subsequently, wire bonding is performed in step S3. First, as shown in FIG. 10, the lead frame 1 is placed on the bonding stage 10, then the back surface 2b of the semiconductor chip 2 is evacuated through chucking holes 10a to chuck and fix the semiconductor chip onto the bonding stage 10. At the same time, the tape 1q on the inner leads 1a is pressed down from above by a clamp portion 11a of the damper 11 to fix the lead frame 1. The clamping portion 11a of the damper 11 presses down the ring-like tape 1q throughout the whole circumference of the tape from above.

In short, in this wire bonding process, the lead frame 1 which carries the semiconductor chip 2 thereon is arranged on the heated bonding stage 10 and the leads (inner leads 1a) are clamped with the damper 11.

The reason why the common leads 1f are not clamped with the damper 11 is that the leads holding-down portion of the damper is formed in the shape of a ring. If the common leads 1f are clamped with the damper 11 of such a shape, the front end portions (wire-coupling areas) of the inner leads 1a are covered with the damper 11 and hence it becomes difficult to couple the pads (electrodes) 2c of the semiconductor chip 2 and the inner leads 1a with each other through wires (first wires 4a, wires for leads) 4.

In this way all the inner leads 1a are clamped by the clamp portion 11a in wire bonding. In this case, the four bar leads 1f are not clamped, as shown in FIGS. 9 and 10.

In this state, wire bonding is performed using a capillary 9, as shown in FIG. 4. For example, as shown in FIG. 10, pads 2c for signal of the semiconductor chip 2 and inner leads la for signal are coupled together electrically through the first wires 4a. On the other hand, pads 2c for power supply (or GND) of the semiconductor chip 2 and the bar leads 1f are coupled together electrically through the second wires 4b.

In this case, adjacent wires 4 coupled to adjacent inner leads 1a or adjacent wires 4 coupled to a bar lead 1f and an inner lead 1a are changed in loop height and in this state there is performed wire bonding. By thus changing the loop height between adjacent wires it is possible to prevent the occurrence of a wire touch defect.

In this embodiment, taking the occurrence of the aforesaid wire touch into account, the pads 2c for power supply (or for GND) of the semiconductor chip 2 and the bar leads 1f are coupled together electrically through wires (second wires 4b, wires for common leads) of a small loop height, then the pads 2c for signal of the semiconductor chip 2 and the inner leads 1a for signal are coupled together electrically through wires (first wires 4a, wires for leads) of a large loop height.

In the QFP 6, three out of the four bar leads 1f are coupled nearly centrally to inner leads 1a. In the wire bonding process, therefore, those three bar leads 1f are difficult to undergo deformation caused by a thermal strain, but as to the bar lead 1f not centrally coupled to inner leads 1a, a thermal strain is apt to concentrate thereon and deformation occurs easily. However, since the bar lead 1f not centrally coupled to inner leads 1a is formed with such second offset portions 1p as shown in FIG. 8, the bar lead 1f can be brought into close contact with the bonding stage 10 during wire bonding.

In assembling the semiconductor device (QFP 6) of this embodiment, since the first slits 1g are formed in the first coupling portions 1j of the bar leads 1f for coupling with the suspending leads 1e, even if an expanding or contracting (thermal strain) action caused by the influence of heat during wire bonding is exerted on the bar leads 1f, it can be relieved by the first slits 1g.

Consequently, it is possible to diminish deflection (deformation) caused by expansion or contraction of the bar lead 1f and hence possible t prevent the occurrence of wire peeling.

Thereafter, resin molding and baking are performed in step S4 in FIG. 5. In this step, the semiconductor chip 2, bar leads if, inner leads 1a and wires 4 are sealed by, for example, molding with use of sealing resin to form a sealed body 3.

Subsequently, exterior plating is performed in step S5. In this step, exterior plating 12 is formed for outer leads 1b exposed from the sealing body 3.

Then, cutting and forming are performed in step S6. In this step, the outer leads 1b are cut and bent to complete assembling of the QFP 6.

The following description is now provided about the importance of the first slits 1g formed in the first coupling portions 1j of the bar leads 1f for coupling with the suspending leads 1e in the QFP 6 of this embodiment.

The present inventors have found out that in case of applying the bar leads 1f to the QFP 6, if slits are not formed respectively in the coupling portions of the bar leads 1f for coupling with the suspending leads 1e, the manufacture of the semiconductor device (QFP 6) is difficult in the following point. That is, as a result of adopting the small tab structure, the length of each suspending lead 1e becomes larger and hence the suspending leads 1e become easier to deflect. One solution to this problem may be enlarging the width of each suspending lead 1e to enhance the rigidity thereof.

On the other hand, in the case of a semiconductor chip requiring a large number of pads for power supply or GND for the purpose of improving electrical characteristics, the number of external terminals increases and the package size becomes larger. For suppressing the increase of package size it is necessary to use the bar leads 1f. In this case, since the bar leads 1f are not clamped by the jig (clamper 11) during wire bonding, they are fixed at both ends to the suspending leads 1e, thereby ensuring stability of the bar leads 1f.

However, the lead frame 1 formed of metal such as a copper alloy is apt to expand under the influence of heat. Consequently, the bar leads themselves extend at both ends thereof under the expanding action. But, at this time, the tendency of the expansive elongation of the bar leads 1f is obstructed because the suspending leads 1e are formed thick for rigidity improvement.

As a result, the bar leads 1f are deflected.

By forming the first slits 1g respectively in the first coupling portions 1j of the bar leads 1f for coupling with the suspending leads 1e, it becomes possible to release the expanded bar leads 1f and hence possible to prevent deflection (deformation) of the bar leads 1f. That is, in manufacturing the multi-pin semiconductor device (QFP 6) using the lead frame 1, it is important to form the first slits 1f respectively in the first coupling portions 1j of the bar leads 1f for coupling with the suspending leads 1e.

Thus, in the QFP 6 of this embodiment, the bar leads 1f coupled to the suspending leads 1e are arranged outside the tab 1c so as to surround the tab and the first slits 1g are formed respectively in the first coupling portions 1j of the bar leads 1f for coupling with the suspending leads 1e, so that even if an expanding or contracting (thermal strain) action caused by the influence of heat is exerted on the bar leads 1f, it can be relieved by the first slits 1g.

Consequently, it is possible to diminish deflection (deformation) caused by expansion or contraction of the bar leads 1f and hence possible to prevent the occurrence of wire peeling.

Further, by thickening the suspension leads 1e, not only the expansive elongation of the bar leads 1f is obstructed, but also voids are apt to be formed in the interior of the resulting sealing body 3 because the fluidity (flow velocity) of the resin flowing near the suspending leads 1e is different from that in the area where the inner leads 1a are arranged.

However, by forming the first slits 1g as in this embodiment, the suspending leads 1e can be formed almost equally in thickness to the inner leads 1a, whereby the fluidity (flow velocity) of the resin flowing in the area of inner leads 1a and that of the resin flowing in the area of the suspension leads 1e can be made almost equal to each other and hence it is possible to suppress the formation of voids.

Therefore, it becomes possible to effect wire bonding to the bar leads 1f.

As a result, it is possible to implement the manufacture of the multi-pin QFP 6 using the lead frame 1.

Moreover, the cost of the QFP 6 can be reduced by manufacturing it with use of the lead frame 1.

Further, the occurrence of wire shorting can be decreased because it is possible to diminish deflection caused by expansion or contraction of the bar leads if. Consequently, it is possible to improve the reliability and quality of the QFP 6.

Next, with reference to FIGS. 12 to 14, a description will be given below about a modification of the above embodiment.

FIG. 14 illustrates a semiconductor device according to a modification of the above embodiment. As shown in FIG. 12, this semiconductor device is a QFP 13 of a large tab 1u structure with a chip mounting portion being larger in size than a semiconductor chip 2.

In the QFP 13, projecting portions 1w of the large tab 1u projecting from the semiconductor chip 2 are used as common leads. Wires 4 such as power supply and GND wires are coupled to the projecting portions 1w of the large tab 1u to effect a common use of leads.

More specifically, the QFP 13 of this modification corresponds to the QFP 6 shown in FIGS. 1 to 3 except that the bar leads 1f are omitted for completely preventing deformation of the bar leads 1f caused by a thermal strain. As a substitute for the bar leads 1f there is adopted a large tab (larger than the dimension of the semiconductor chip) 1u, its projecting portions 1w are used as common leads and wires 4 such as power supply and GND wires are coupled to the projecting portions 1w.

In this case, the adhesion between the lead frame 1 formed of a copper alloy and the sealing resin is lower than the adhesion between the semiconductor chip 2 formed of silicon and the sealing resin, so that peeling is apt to occur at the interface between the large tab 1u and the sealing resin. Therefore, in the case of the large tab 1u, the area of contact between the large tab 1u and the sealing resin is large and the area of contact between the semiconductor chip 2 and the sealing resin is smaller than in the small tab structure, so that the aforesaid problem of peeling defect becomes more marked. In view of this point, as shown in FIGS. 12 and 13, plural through holes 1v are formed in the large tab 1u and sealing resin is passed through the through holes 1v to enlarge the area of contact between the semiconductor chip 2 and the sealing resin, whereby the problem of peeling which occurs at the interface between the sealing resin and the large tab 1u is suppressed even in case of adopting the large tab 1u.

Though not shown, the wires 4-coupled area of the large tab 1u is silver-plated to form a plating film (plating layer). Since the silver plating is relatively low in its adhesion to the molding resin, it is not applied to the whole surface of the tab, whereby it is possible to improve the adhesion between the molding resin and the large tab 1u and hence possible to improve the reliability and quality of the semiconductor device.

Since the bar leads 1f are not provided in the QFP 13 of the modification, the coupling portions (projecting portions 1w) of the second wires 4b for power supply or GND can be prevented from deflection.

Further, since the large tab 1u is fixed by coupling the front ends of specific inner leads 1a to the large tab as shown in FIG. 13, the large tab 1u can be prevented from rotating in the horizontal direction.

Although the present invention has been described above concretely by way of an embodiment thereof, it goes without saying that the present invention is not limited to the above embodiment, but that various changes may be made within the scope not departing from the gist of the invention.

For example, although in the above embodiment reference has been made to an example in which the number of the bar leads 1f coupled nearly centrally to inner leads 1a out of the four bar leads 1f is three, no limitation is made thereto. The number of such bar leads may be any other number than three.

Further, although in the above embodiment the semiconductor chip 2 is chucked by the chucking collet 8, no limitation is made thereto. In the case where the dimension of the semiconductor chip 2 is relatively small when looking from the bar leads 1f, there may be used a collet having a pyramid-shaped chip holding portion for holding the semiconductor chip 2.

Figure 16:
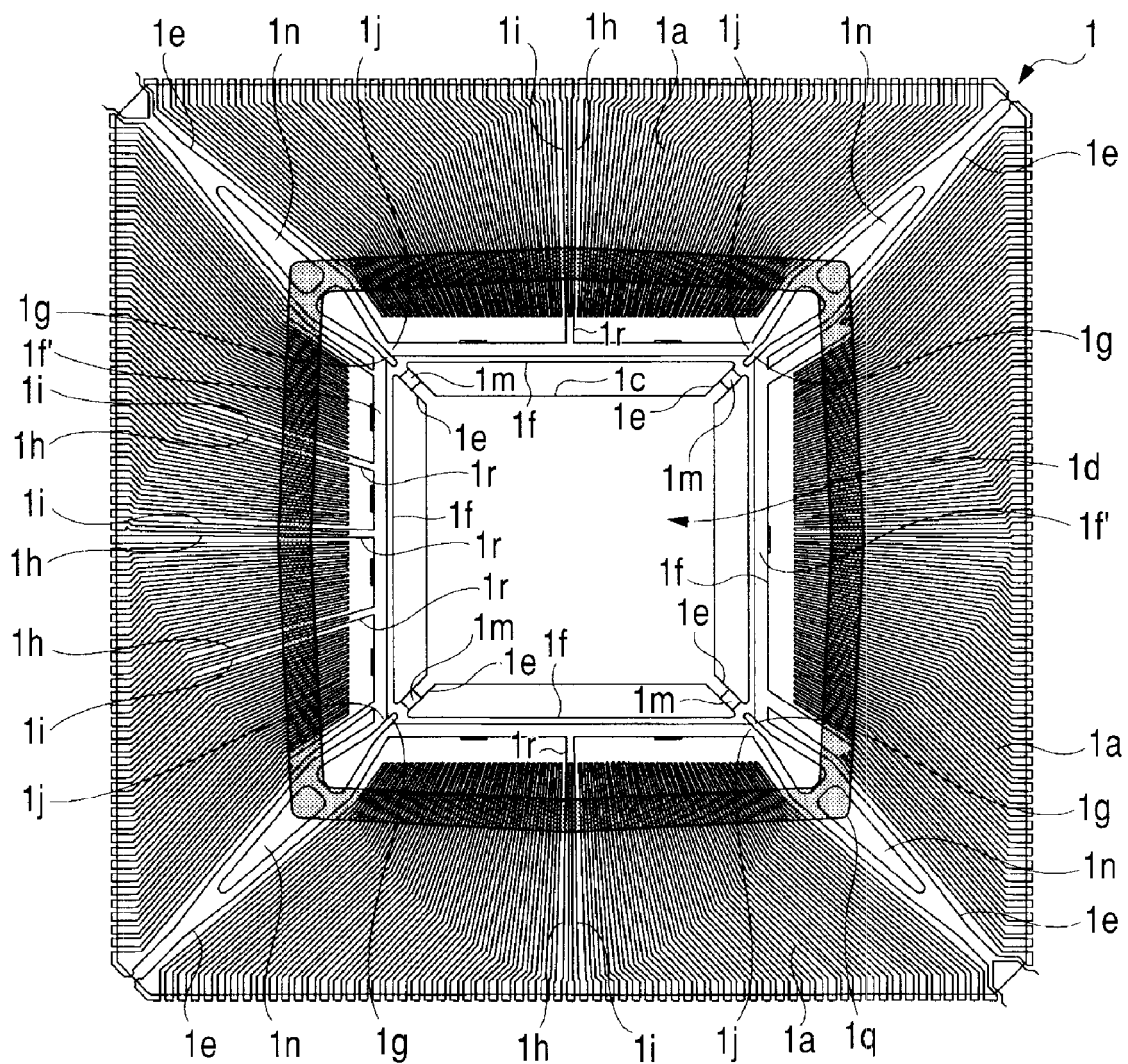
FIG. 16 is a partial plan view showing a structural example of a lead frame adopting a large tab and used in assembling a semiconductor device in the embodiment of the present invention.
Figure 17:
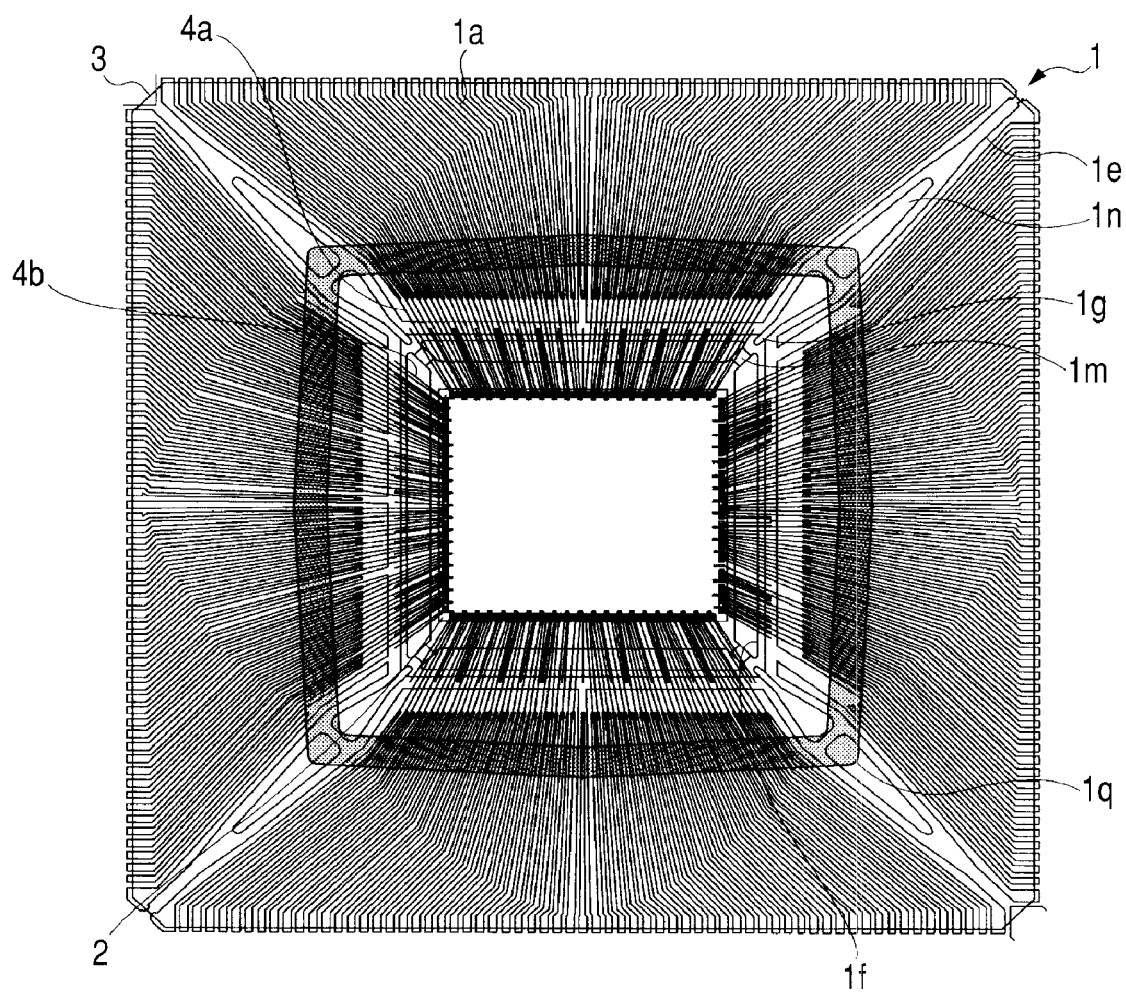
FIG. 17 is a partial plan view showing through a sealing body a structural example after resin molding in assembling a semiconductor device with use of the lead frame shown in FIG. 16.
Figure 18:
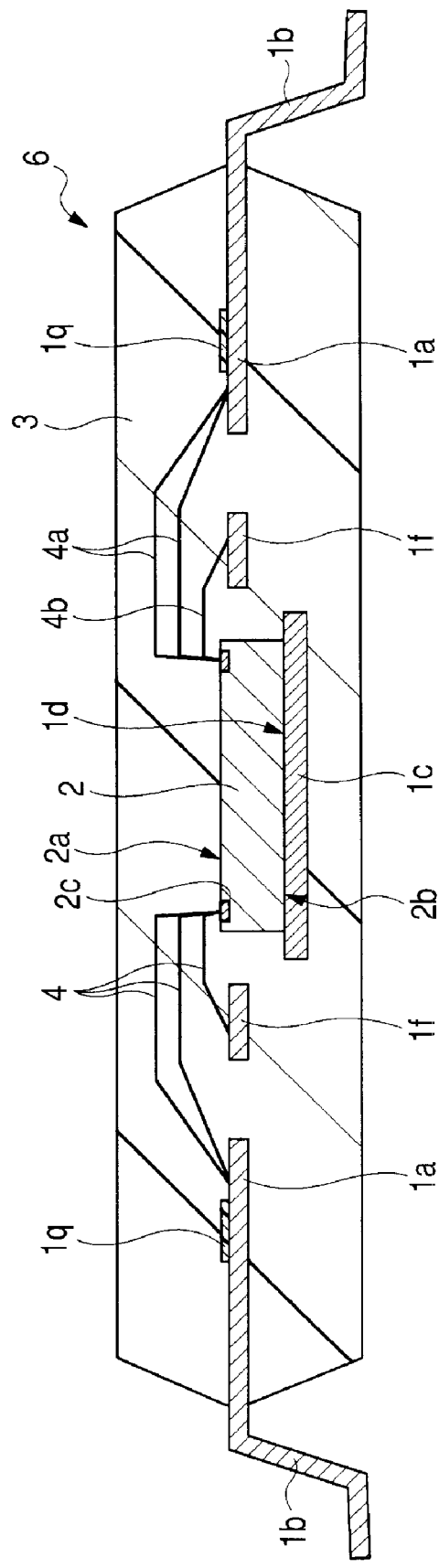
FIG. 18 is a sectional view showing a structural example of the semiconductor device shown in FIG. 17.

Although in the previous embodiment reference has been made to the semiconductor device of a small tab structure, no limitation is made thereto. For example, 1f attention is made to only suppressing the deflection of common leads (bar leads, bus bar leads) if, such a semiconductor device as shown in FIGS. 17 and 18 may be constructed by using such a lead frame 1 as shown in FIG. 16. The lead frame 1 includes a chip mounting portion (tab, die pad) 1c having a chip supporting surface 1d for the semiconductor chip 2, and the dimension of the chip supporting surface 1d is larger than the back surface 2b of the semiconductor chip 2.

Figure 19:
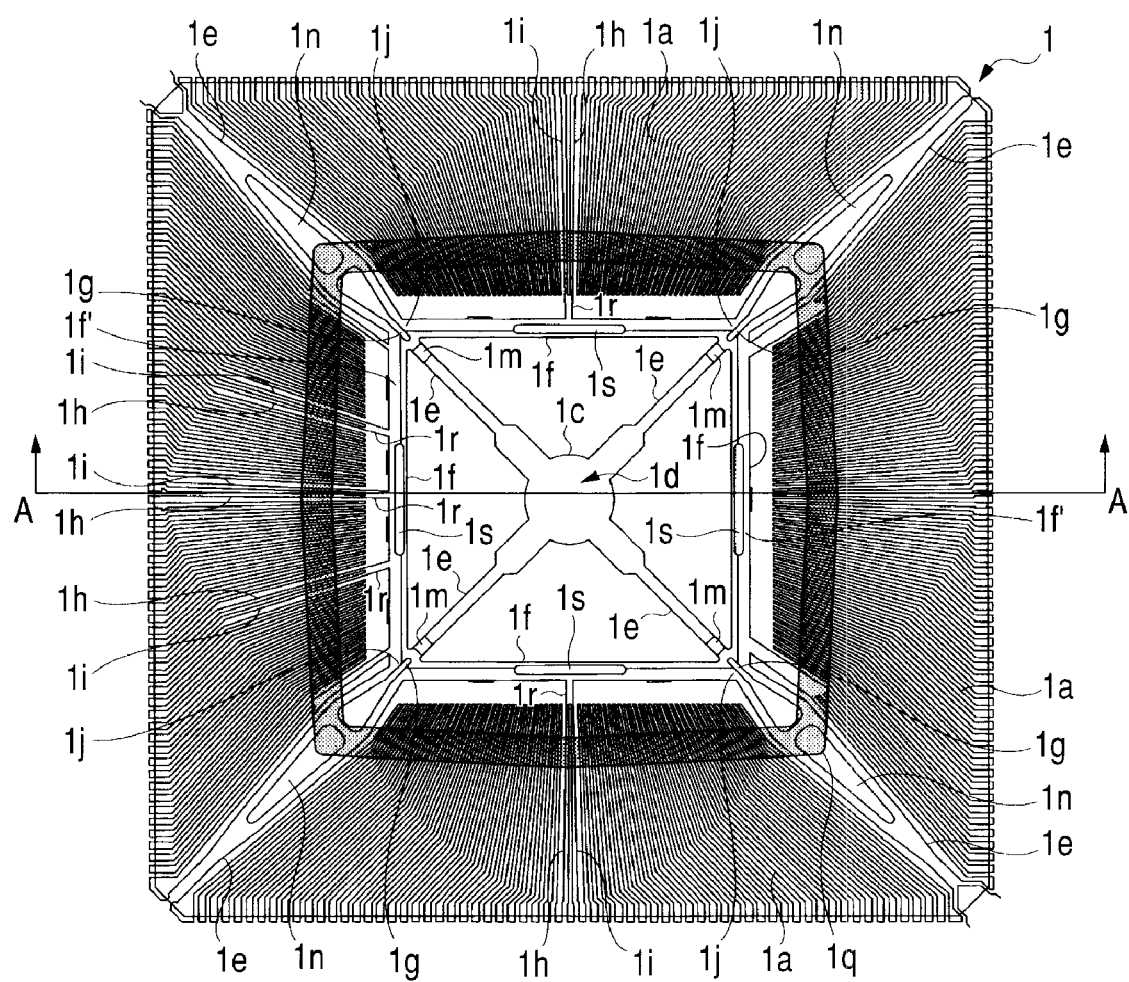
FIG. 19 is a partial plan view showing a structural example of a lead frame having slits in common leads in the embodiment of the present invention.
Figure 20:
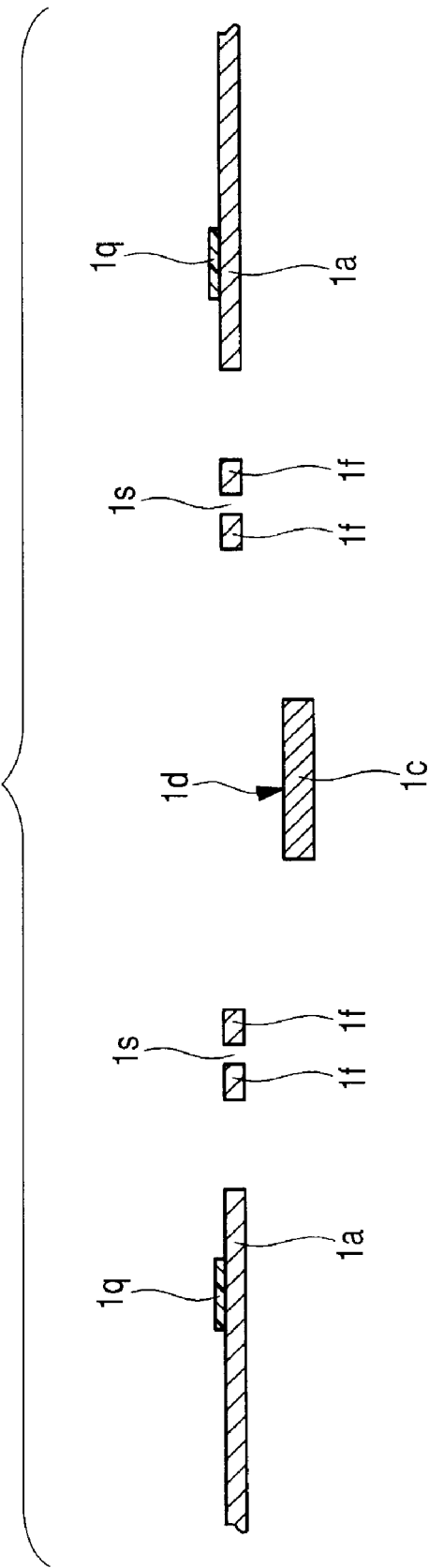
FIG. 20 is a sectional view showing a structural example taken along line A-A in FIG. 19.
Figure 21:
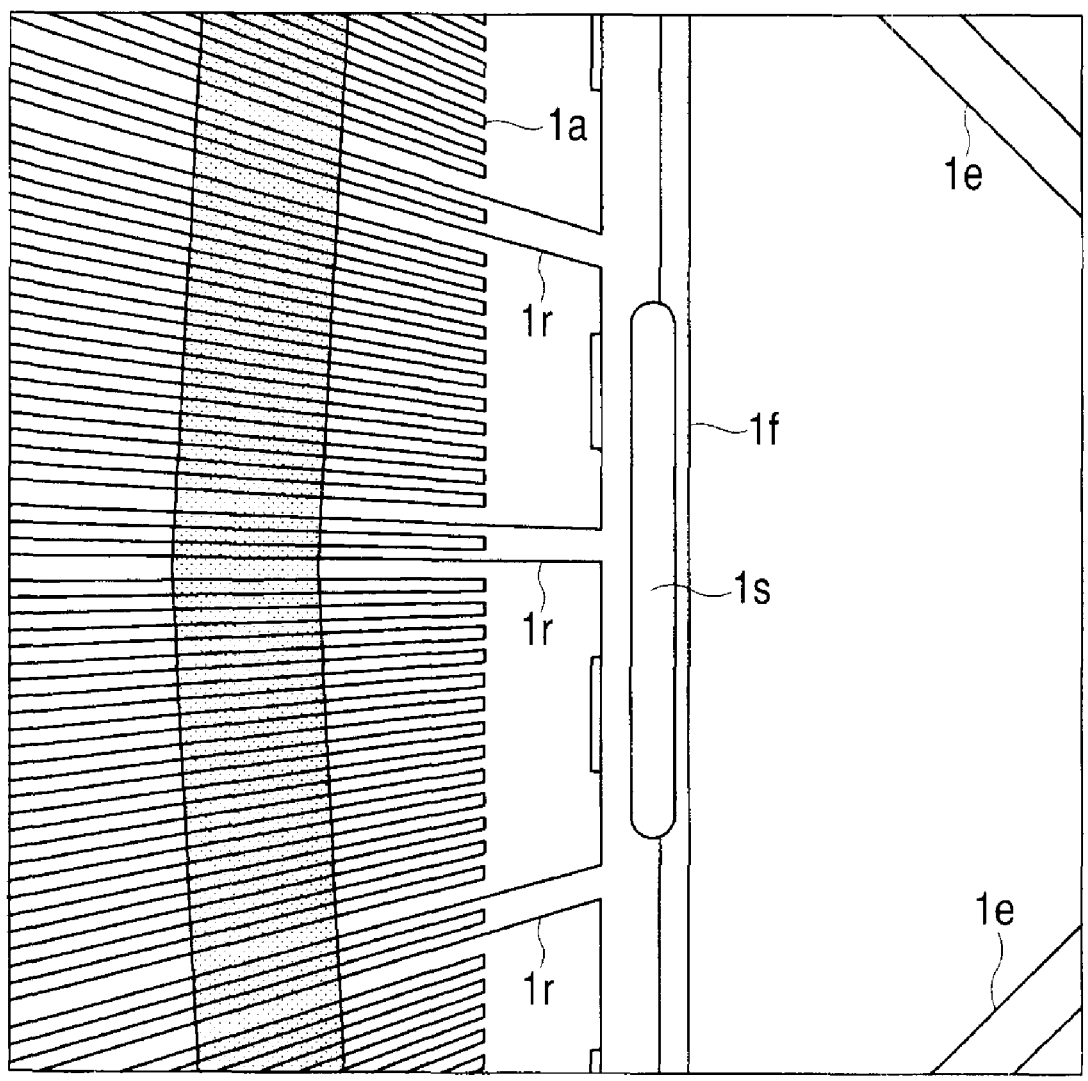
FIG. 21 is an enlarged partial plan view showing a structural example of a slit-forming portion in the lead frame shown in FIG. 19.
Figure 22:
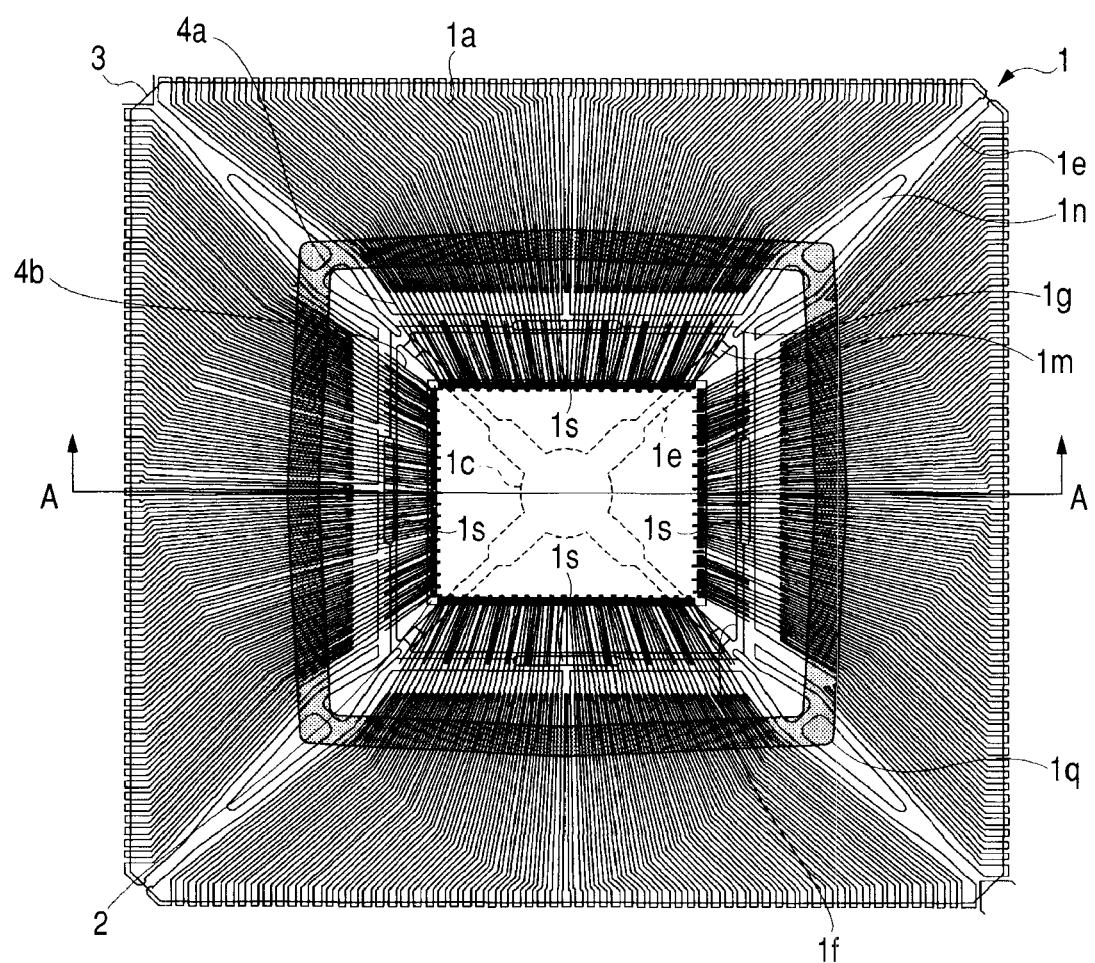
FIG. 22 is a partial plan view showing through a sealing body a structural example after resin molding in assembling a semiconductor device with use of the lead frame shown in FIG. 19.
Figure 23:
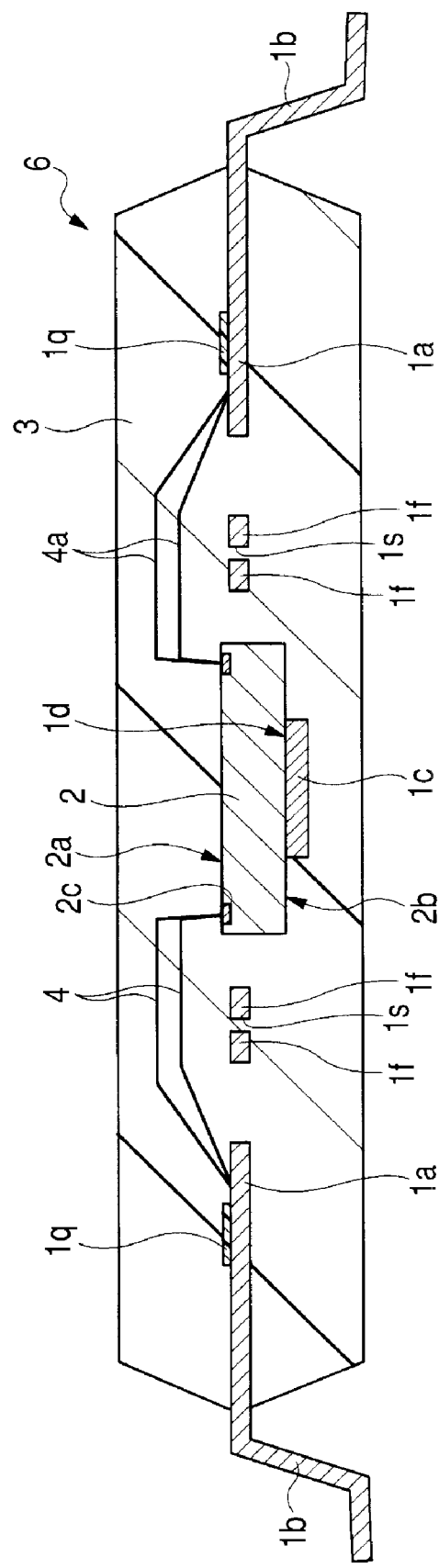
FIG. 23 is a sectional view showing a structural example taken along line A-A in FIG. 22.
Figure 24:
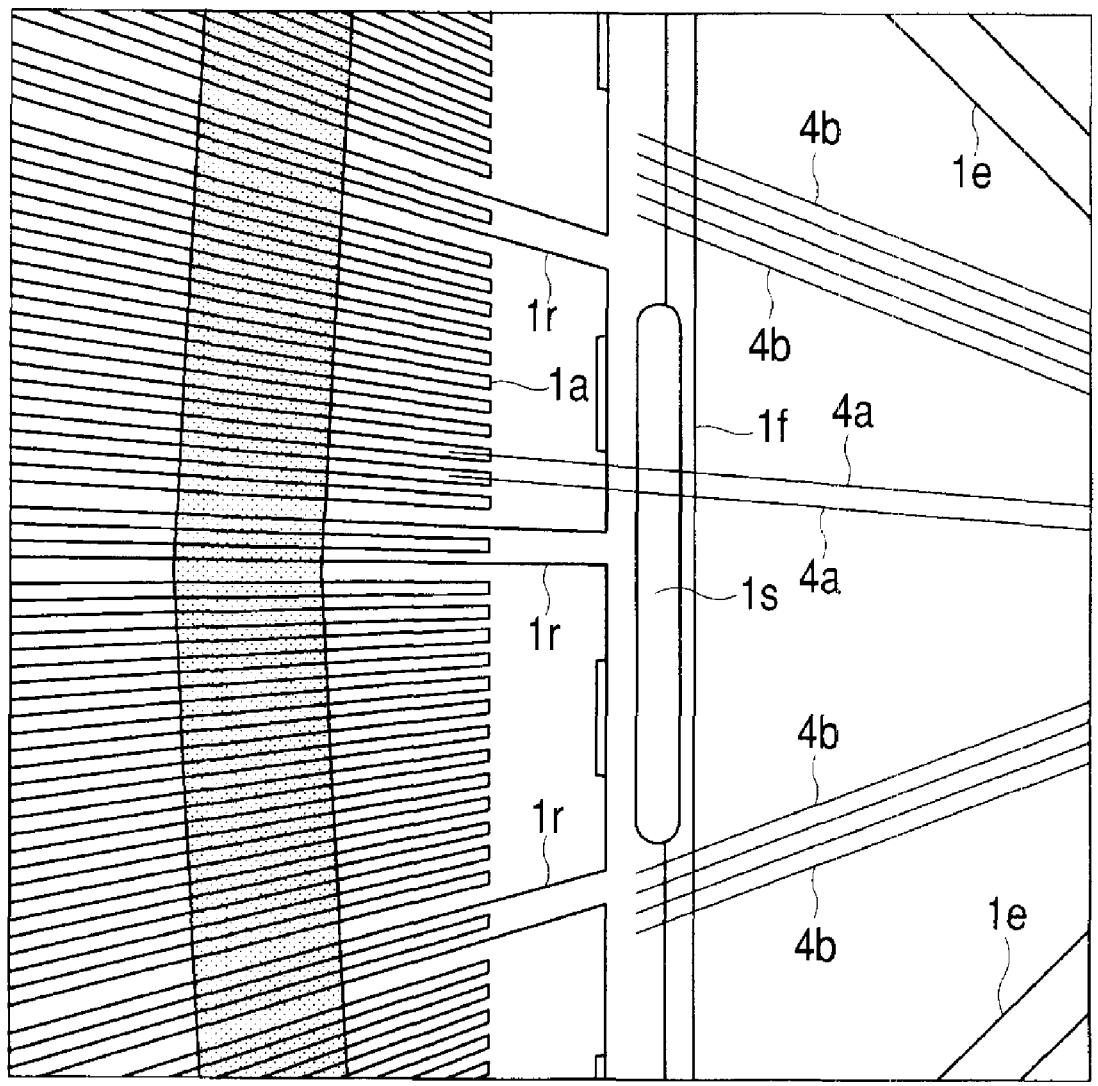
FIG. 24 is an enlarged partial plan view showing a structural example of a slit-forming portion in the structure shown in FIG. 22.

Although in the previous embodiment reference has been made to forming a slit (first slit 1g) in the portion, to which end portions of common leads 1f are coupled, in each suspending lead 1e, and thereby suppressing deflection of the common leads 1f under the influence of heat of the bonding stage, no limitation is made thereto. For example, as shown in FIGS. 19, 20 and 21, there may be used a lead frame 1 having slits (through holes, holes) 1s as stress mitigating means each formed in part (central part) of each common lead (bar lead, bus bar lead) 1f. In this case, the area permitting coupling of wires (second wires 4b) 4 in each common lead 1f becomes smaller than in the previous embodiment. However, in the case where the number of pads (electrodes) 2a of the semiconductor chip 2 is smaller than in the previous embodiment, the wires 4 can be coupled sideways of each slit (third slit Is), as shown in FIGS. 22, 23 and 24. In FIG. 24, the number of wires 4 coupled to the pads 2a of the semiconductor chip 2 and inner leads 1a is omitted in order to make sure that the wires 4 are coupled sideways of each slit (third slit 1s).

Figure 25:
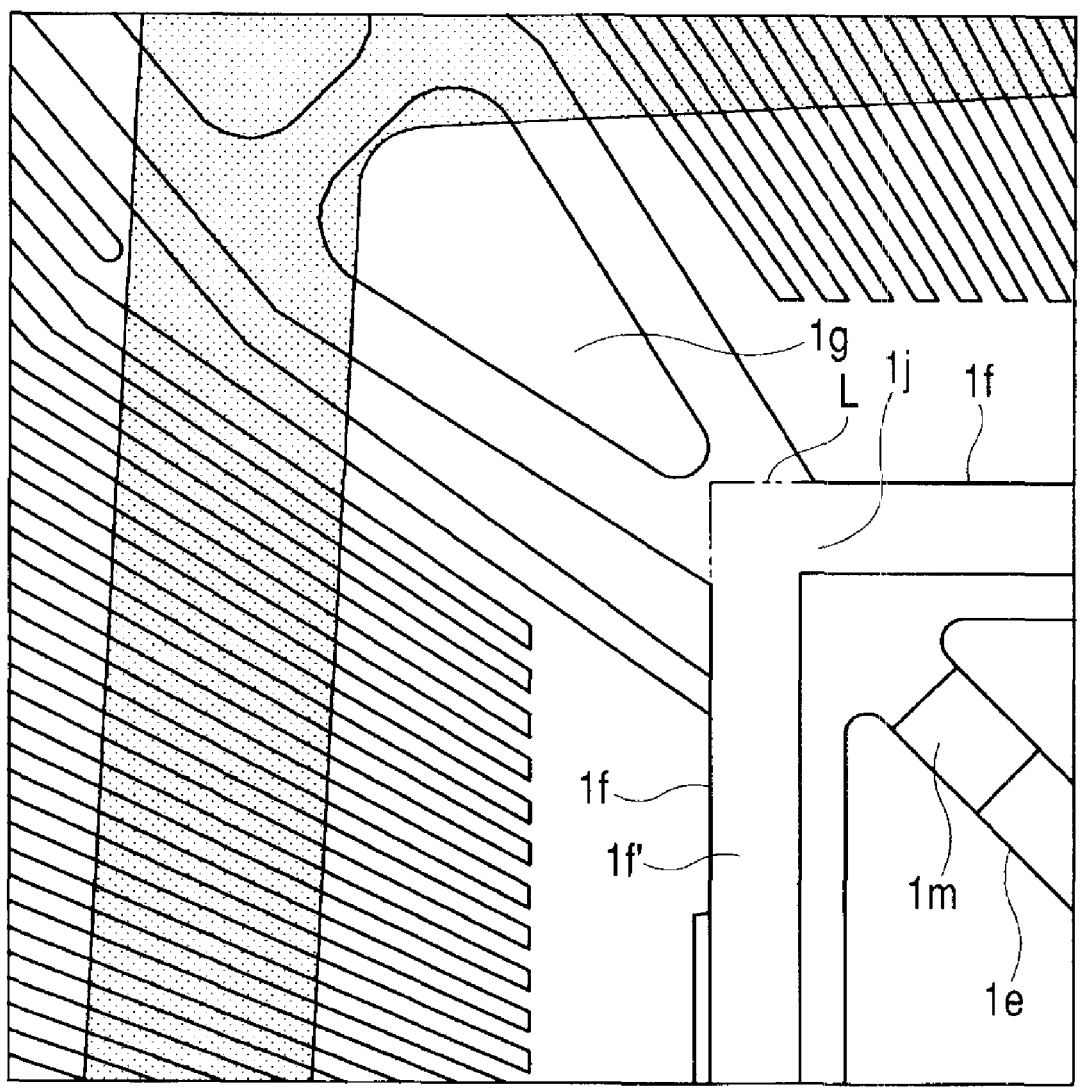
FIG. 25 is an enlarged partial plan view showing the structure of a modified example of means for mitigating stress imposed on common leads in the embodiment of the present invention.

Although in the previous embodiment reference has been made to the case where each slit (first slit 1g) is formed on extension lines of common leads 1f in the associated suspending lead 1e, as indicated by dash-double dot lines (phantom lines) in FIG. 6B, no limitation is made thereto. When the heat of the wire bonding stage 10 in the wire bonding process is lower than the temperature used in the previous embodiment, expansion of the common leads 1f becomes difficult to occur as compared with the previous embodiment. For example, therefore, as shown in FIG. 25, the slit (first slit 1g) may be formed in a position more distant from the tab 1c than the position on the extension lines L of the common leads 1f.

Figure 26:
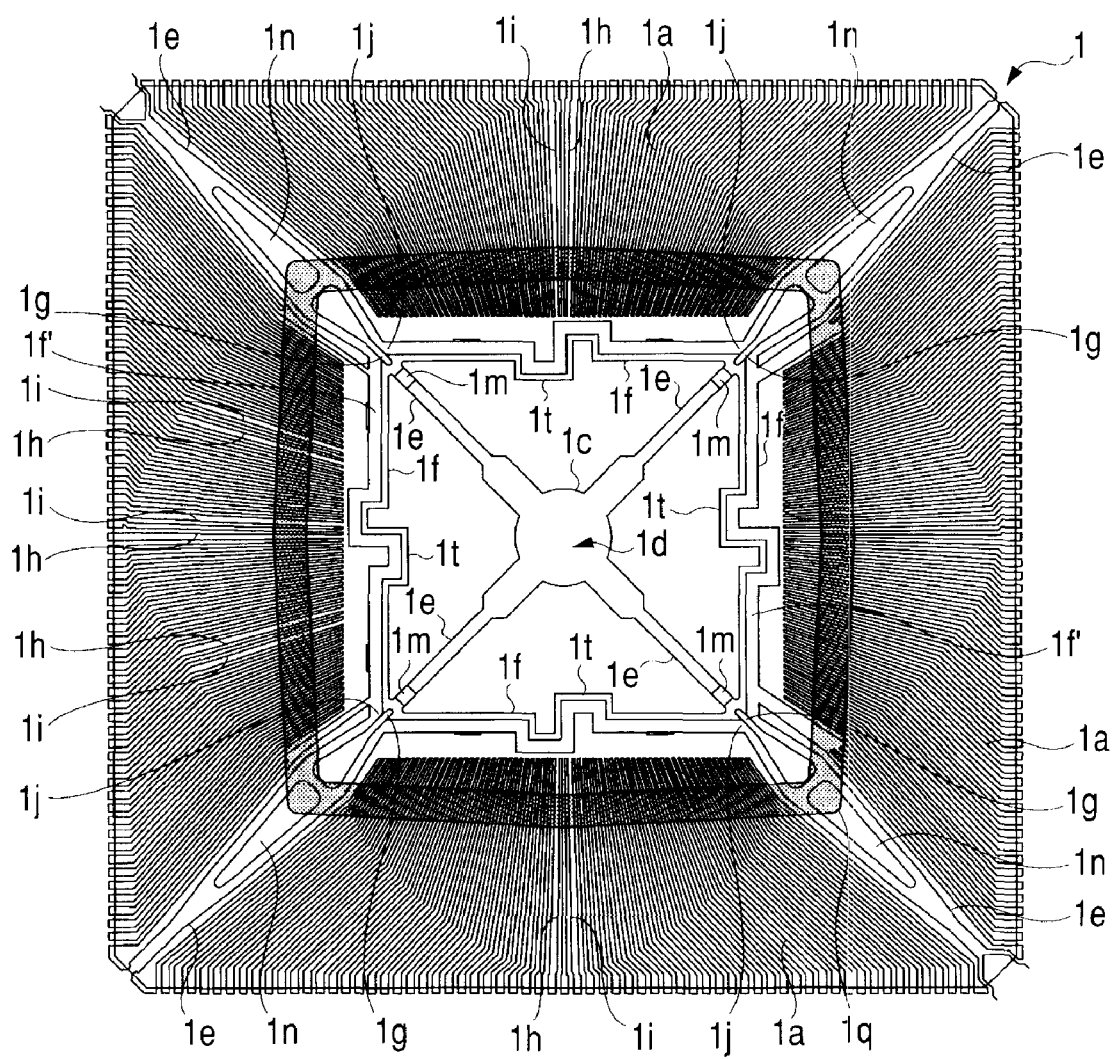
FIG. 26 is a partial plan view showing the structure of another modified example of means for mitigating stress imposed on common leads in the lead frame used in the embodiment of the present invention.
Figure 27:
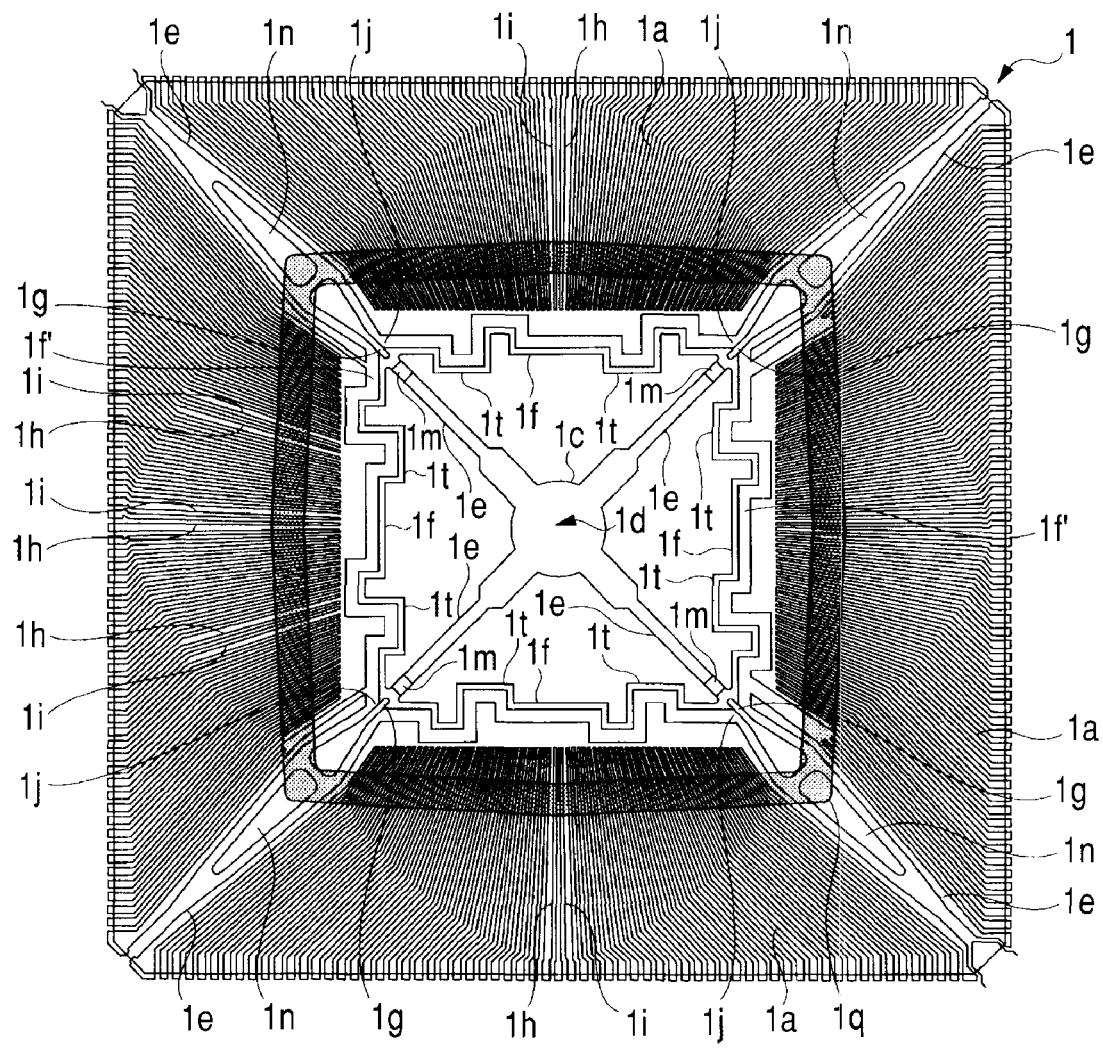
FIG. 27 is a partial plan view showing the structure of a further modified example of means for mitigating stress imposed on common leads in the lead frame used in the embodiment of the present invention.

Although in the above embodiment and modification reference has been made to forming slits as stress mitigating means in the suspending leads 1e or common leads 1f, no limitation is made thereto. For example, a part of each common lead 1f may be meandered as in FIG. 26, or both end portions of each common lead may be meandered as in FIG. 27. Even if the common leads 1f expand under the influence of heat in such a configuration, it is possible to suppress deflection of the common leads 1f because the meandered portions, indicated at it, contract.

Figure 28A:
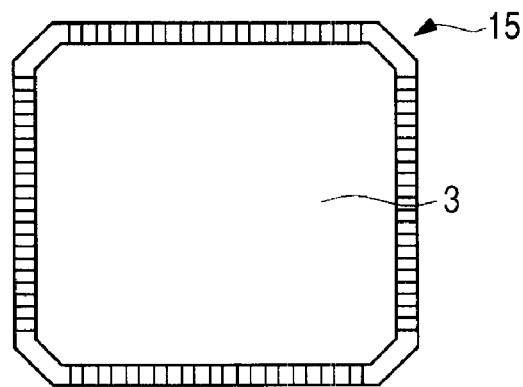
Figure 28B:
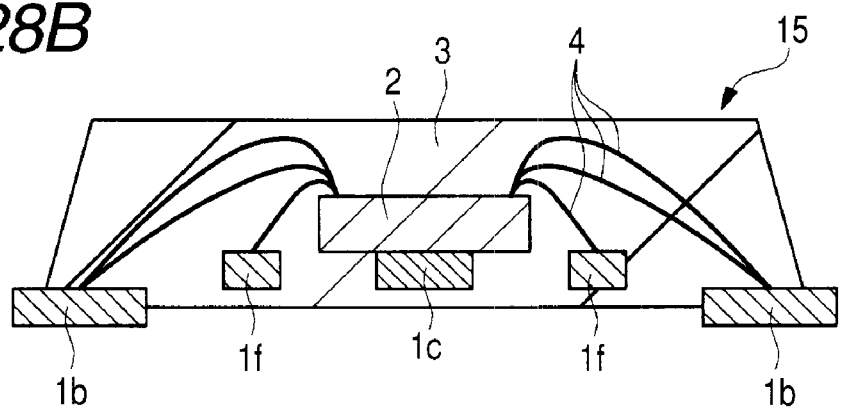
Figure 28C:
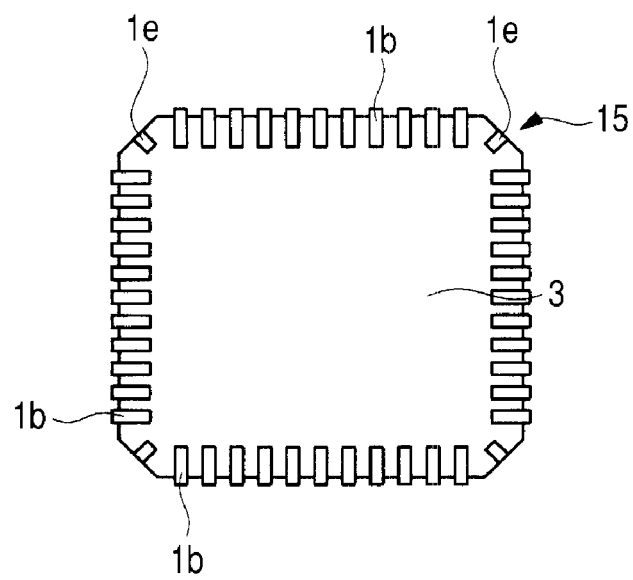

Although in the previous embodiment reference has been made to the case where the configuration of the present invention is applied to the QFP type semiconductor device wherein the outer leads 1b project from side faces of the sealing body 3, as well as a manufacturing method for the semiconductor device, no limitation is made thereto. For example, as shown in FIGS. 28(a), 28(b) and 28(c), the configuration of the present invention may be applied to a QFN (Quad Flat Non-leaded Package) 15 type semiconductor device wherein a tab 1c and common leads 1f are positioned in the interior of a sealing body 3 and only plural leads (outer leads 1b) are exposed from a lower surface (component side, back surface) of the sealing body 3.

Figure 29A:
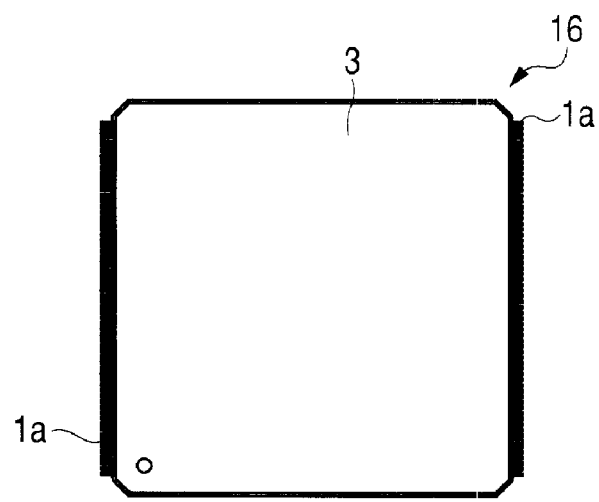
Figure 29B:
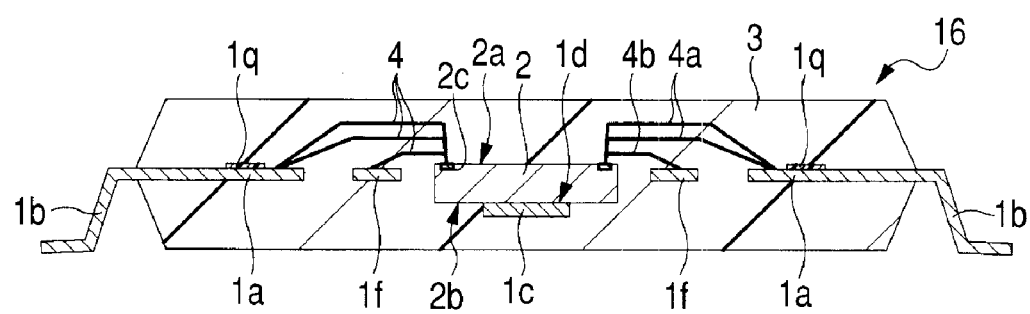
Figure 29C:
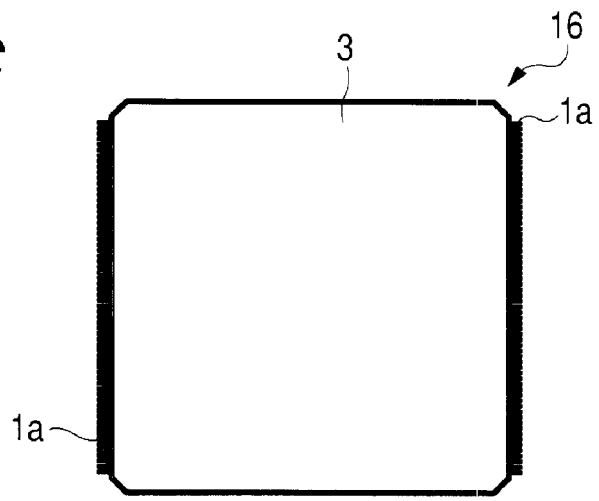
Figure 30A:
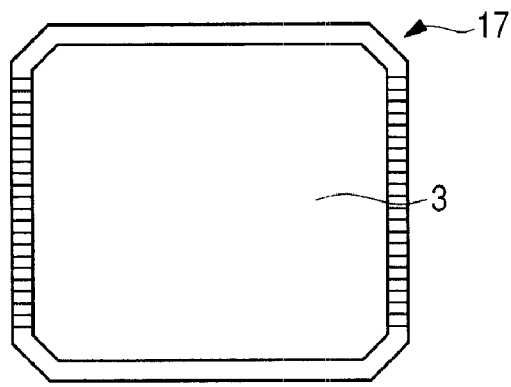
Figure 30B:
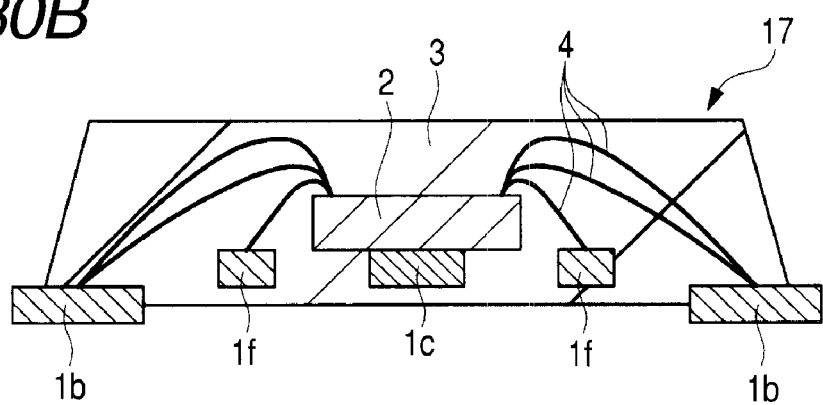
Figure 30C:
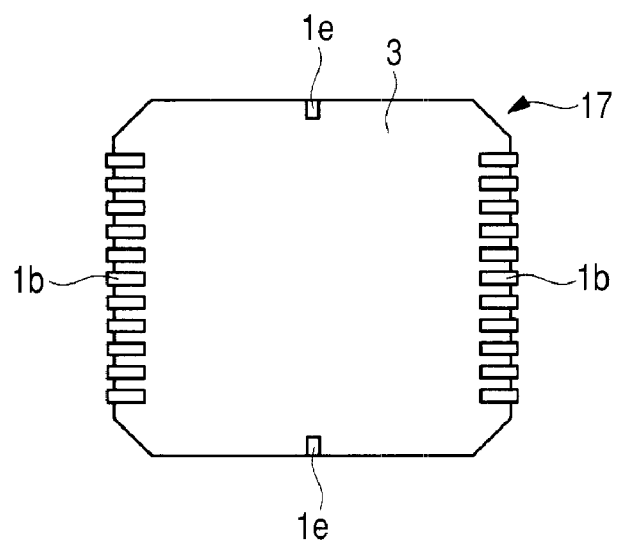

Although reference has been made to the case where the configuration of the present invention is applied to the QFP type semiconductor device wherein plural leads are arranged along the four sides of a sealing body 3 having a square plane shape, as well as a manufacturing method for the semiconductor device, no limitation is made thereto. For example, the configuration of the present invention may be applied to an SOP (Small Outline Package) 16 type semiconductor device wherein a tab 1c and common leads 1f are positioned in the interior of a sealing body 3 and plural leads are arranged along two sides of the sealing body 3 as in FIGS. 29(a), 29(b) and 29(c) or to such an SON (Small Outline Non-leaded Package) 17 type semiconductor device as shown in FIGS. 30(a), 30(b) and 30(c).

Figure 31A:
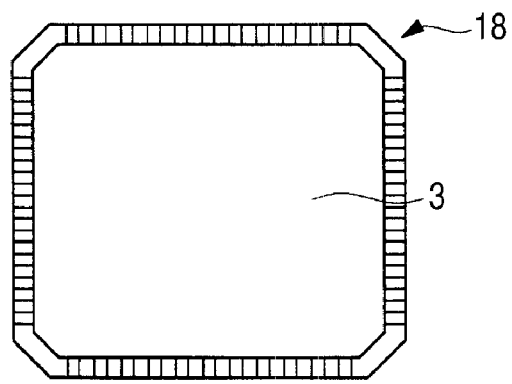
Figure 31B:
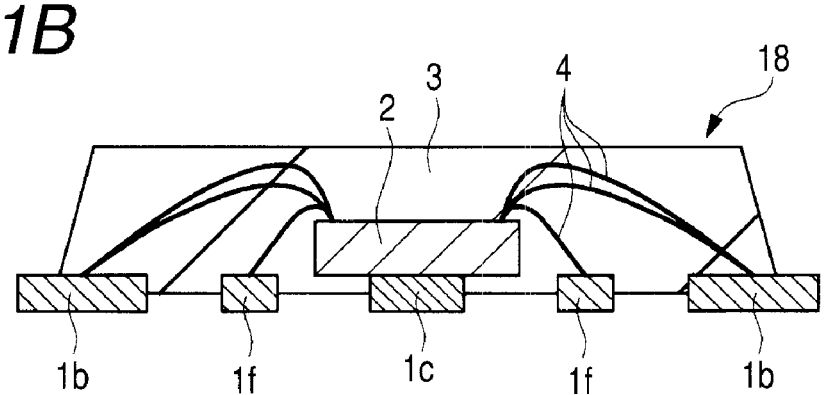
Figure 31C:
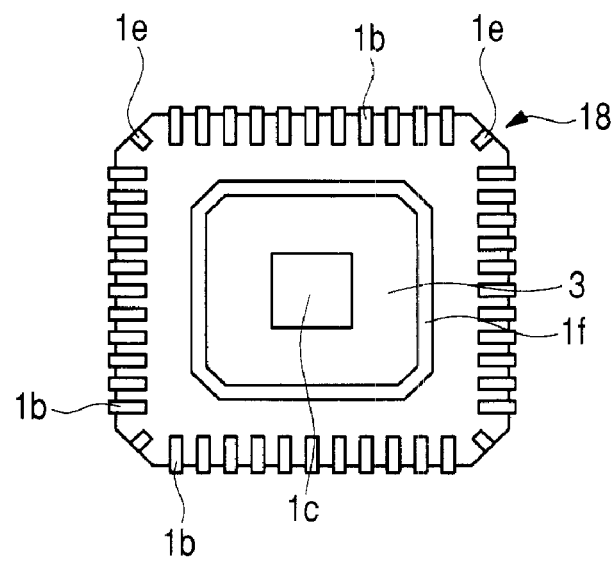
Figure 32A:
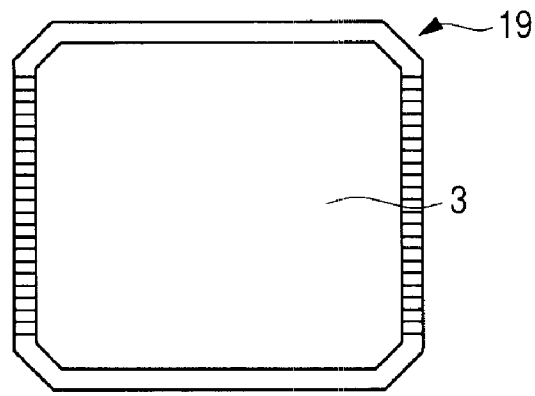
Figure 32B:
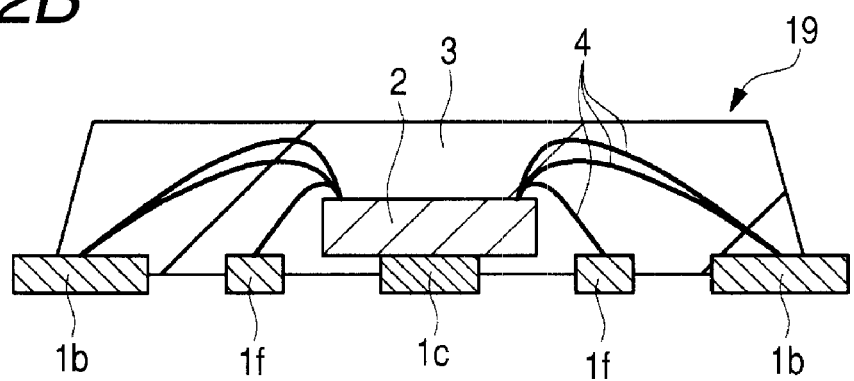
Figure 32C:
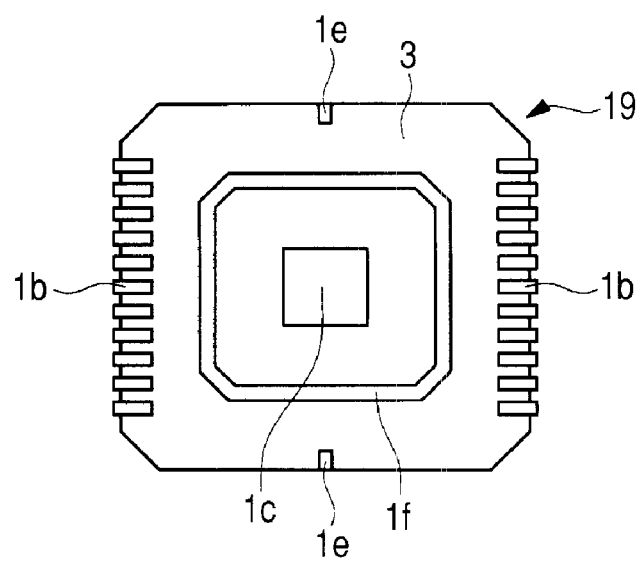

Further, the configuration of the present invention may be applied to a QFN (Quad Flat Non-leaded Package) 18 type semiconductor device wherein a tab 1c, common leads 1f and plural leads (outer leads 1b) are exposed from a lower surface (component side, back surface) of a sealing body 3 as in FIGS. 31(a), 31(b) and 31(c). Likewise, the configuration of the present invention may be applied to an SON (Small Outline Non-leaded Package) 19 type semiconductor device wherein a tab 1c, common leads 1f and plural leads (outer leads 1b) are exposed from a lower surface (component side, back surface) of a sealing body 3 as in FIGS. 32(a), 32(b) and 32(c).

What is claimed is:

1. A semiconductor device comprising:
a chip mounting portion having a chip supporting surface capable of supporting a semiconductor chip,
wherein a dimension of the chip supporting surface is smaller than that of a back surface of the semiconductor chip;
a plurality of leads arranged around the chip mounting portion;
the semiconductor chip mounted over the chip supporting surface of the chip mounting portion;
a plurality of suspending leads for supporting the chip mounting portion;
bar-like common leads arranged outside the chip mounting portion such that the common leads surround the chip mounting portion and coupled to the suspending leads via first coupling portions;

a first wire electrically coupling an electrode of the semiconductor chip with a respective one of the plurality of leads;

a second wire electrically coupling an electrode of the semiconductor chip with one of the common leads, and a sealing body for sealing the semiconductor chip, the chip mounting portion, the first wire and the second wire, wherein a first slit is formed in each suspending lead, and wherein a width of each common lead is smaller than a width of a portion of each suspending lead that includes the respective first slit.

2. A semiconductor device according to claim 1, wherein each of the leads comprises an inner lead and an outer lead, and among the inner leads, each of the inner leads coupled to the common leads includes a first inner lead, a second inner lead adjacent to the first inner lead, and a second coupling portion for coupling between the first and second inner leads at an end thereof on the associated common lead side.

3. A semiconductor device according to claim 2, wherein outer ends of the first and second inner leads are branched from each other.

4. A semiconductor device according to claim 2, wherein the second coupling portion is arranged between the common lead-side ends of the first and second inner leads and the common lead.

5. A semiconductor device according to claim 2,
wherein four of the common leads are arranged along four sides of a main surface of the semiconductor chip and are coupled at respective opposite ends thereof to the suspending leads, and
wherein, among the four common leads, one common lead which is not coupled to a front end of an inner lead at any other portion than both ends thereof is formed with an offset portion.

6. A semiconductor device according to claim 5, wherein an offset portion is formed near each end of the one common lead.

7. A semiconductor device according to claim 5, wherein an offset quantity of the offset portion of the one common lead is smaller than that of a first offset portion of each suspending lead.

8. A semiconductor device according to claim 5, wherein the offset portion is formed in a portion at which the one common lead is not coupled to any inner lead.

9. A semiconductor device according to claim 8, wherein all of the inner leads not coupled to the common leads are leads for signals.

10. A semiconductor device according to claim 1, wherein each of the leads comprises an inner lead and an outer lead coupled thereto, and the wires coupled to adjacent ones of the inner leads are different in loop height.

11. A semiconductor device according to claim 1, wherein the chip mounting portion, the leads, the suspending leads and the common leads are each formed of a copper alloy.

12. A semiconductor device according to claim 1, wherein first offset portions are formed at positions inside first coupling portions for coupling between the suspending leads and the common leads.

13. A semiconductor device according to claim 1, wherein the first slits are formed in the first coupling portions.

14. A semiconductor device according to claim 1, wherein the suspending leads extend in diagonal directions of a main surface of the semiconductor chip.

15. A semiconductor device according to claim 1,
wherein four of the common leads are arranged along four sides of a main surface of the semiconductor chip and are coupled at respective opposite ends thereof to the suspending leads, and
wherein main surfaces of the four common leads are partially formed with a plating layer.

16. A semiconductor device according to claim 1,
wherein the first slits are formed so as to extend to connecting portions of the suspending leads and the common leads.

17. A semiconductor device according to claim 1,
wherein the first slits are cutouts of respective parts of the suspending leads.

18. A semiconductor device according to claim 1,
wherein a second slit is formed in each suspending lead between the respective first slit and an edge of the sealing body.

19. A semiconductor device comprising:

a chip mounting portion;

a plurality of suspending leads integral with the chip mounting portion and each having a slit;

a semiconductor chip having a main surface with a plurality of electrodes formed therein and mounted over the chip mounting portion;

a plurality of inner leads arranged around the semiconductor chip;

a plurality of common leads integral with the suspending leads and positioned respectively between the chip mounting portion and the inner leads;

a plurality of first wires for coupling the electrodes of the semiconductor chip and the inner leads electrically with each other;

a plurality of second wires for coupling the electrodes of the semiconductor chip and the common leads electrically with each other;

a sealing body for sealing the semiconductor chip, the chip mounting portion, the first wires and the second wires; and a plurality of outer leads integral with the inner leads respectively and exposed from the sealing body;

wherein a width of each common lead is smaller than a width of a portion of each suspending lead that includes the respective slit.

20. A semiconductor device according to claim 19, wherein, in the suspending leads, the slits are formed in respective portions to which the common leads are coupled.

21. A semiconductor device according to claim 19, wherein a dimension of the chip mounting portion is smaller than that of a back surface opposite to the main surface of the semiconductor chip.

22. A semiconductor device according to claim 19,
wherein the slits are formed so as to extend to connecting portions of the suspending leads and the common leads.

23. A semiconductor device comprising:

a chip mounting portion;

a plurality of suspending leads integral with the chip mounting portion and each having a slit;

a semiconductor chip mounted over the chip mounting portion and having a main portion with a plurality of electrodes formed therein;

a plurality of inner leads arranged around the semiconductor chip;

a plurality of common leads integral with the suspending leads and positioned between the chip mounting portion and the inner leads, respectively;

a plurality of first wires for coupling the electrodes of the semiconductor chip and the inner leads electrically with each other;

a plurality of second wires for coupling the electrodes of the semiconductor chip and the common leads electrically with each other;

a sealing body for sealing the semiconductor chip, the chip mounting portion, the first wires and the second wires; and a plurality of outer leads integral with the inner leads respectively and exposed from the sealing body, wherein some of the inner leads are coupled to the common leads, and wherein a width of each common lead is smaller than a width of a portion of each suspending lead that includes the respective slit.

24. A semiconductor device according to claim 23, wherein a dimension of the chip mounting portion is smaller than that of a back surface opposite to the main surface of the semiconductor chip.

25. A semiconductor device according to claim 23, wherein the slits are formed so as to extend to connecting portions of the suspending leads and the common leads.

* * * * *